US012684971B2

(12) United States Patent
Wei et al.

(10) Patent No.: US 12,684,971 B2
(45) Date of Patent: Jul. 14, 2026

(54) DISPLAY PANEL AND DISPLAY DEVICE WITH ELECTRODE CONNECTION STRUCTURE IN NON-DISPLAY AREA

(71) Applicants: Wuhan Tianma Micro-Electronics Co., Ltd., Wuhan (CN); Wuhan Tianma Micro-Electronics Co., Ltd. Shanghai Branch, Shanghai (CN)

(72) Inventors: Qibing Wei, Wuhan (CN); Peng Zhang, Wuhan (CN); Qingxia Wang, Wuhan (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

( * ) Notice: Subject to any disclaimer, the term of this patent is extended or adjusted under 35 U.S.C. 154(b) by 478 days.

(21) Appl. No.: 18/234,485

(22) Filed: Aug. 16, 2023

(65) Prior Publication Data

US 2024/0244904 A1     Jul. 18, 2024

(30) Foreign Application Priority Data

Jan. 17, 2023     (CN) ......................... 202310086421.X

(51) Int. Cl.
| | |
|---|---|
| *H10K 59/131* | (2023.01) |
| *H10K 59/10* | (2023.01) |
| *H10K 59/179* | (2023.01) |

(52) U.S. Cl.
CPC ........... *H10K 59/131* (2023.02); *H10K 59/10* (2023.02); *H10K 59/179* (2023.02)

(58) Field of Classification Search
CPC ...... H10K 50/00; H10K 50/805; H10K 50/88; H10K 59/10; H10K 59/1201; H10K 59/131; H10K 59/179; H10K 59/80; H10K 59/805; H10K 59/82
See application file for complete search history.

(56) References Cited

U.S. PATENT DOCUMENTS

2017/0025082 A1 *   1/2017   Kobayashi ............ G02F 1/1339

FOREIGN PATENT DOCUMENTS

| CN | 110718577 A | 1/2020 |
|---|---|---|
| CN | 111323949 A | 6/2020 |
| CN | 111916488 A | 11/2020 |
| CN | 115411081 A | 11/2022 |

* cited by examiner

*Primary Examiner* — Cheung Lee
(74) *Attorney, Agent, or Firm* — Anova Law Group, PLLC

(57)     ABSTRACT
Display panel and display device are provided. The display panel includes: a non-display area including a first non-display area and a second non-display area oppositely arranged along a first direction, and a third non-display area and a fourth non-display area oppositely arranged along a second direction, the first direction intersecting the second direction; a first electrode connection structure at least in the third non-display area and/or the fourth non-display area; and a first area running through the display panel along the first direction, and the first electrode connection structure being outside the first area.

20 Claims, 29 Drawing Sheets

100

100

100

100

100

DISPLAY PANEL AND DISPLAY DEVICE WITH ELECTRODE CONNECTION STRUCTURE IN NON-DISPLAY AREA

CROSS-REFERENCE TO RELATED APPLICATION

This application claims priority of Chinese Patent Application No. 202310086421.X, filed on Jan. 17, 2023, the entire contents of which are hereby incorporated by reference.

FIELD OF THE DISCLOSURE

The present disclosure generally relates to the field of display technology and, more particularly, relates to a display panel and a display device.

BACKGROUND

In an existing display product, as shown in FIG. 1, on left and right frames of a display panel, in a direction pointing from a display area 01 to a non-display area 02, the non-display area 02 includes at least shift register circuit areas 03, power signal wiring areas 04, packaging areas 05, and cutting lines 06. Due to a design of narrowing left and right frames, spaces for the shift register circuit areas 03, the power signal wiring areas 04, the packaging areas 05, and the cutting lines 06 become more and more narrow and approach a limit. However, users still have a design demand for further narrowing frames in a display product. Therefore, it is urgent to provide a design solution that can further narrow frames in a display product.

BRIEF SUMMARY OF THE DISCLOSURE

One aspect of the present disclosure provides a display panel. The display panel includes: a non-display area including a first non-display area and a second non-display area oppositely arranged along a first direction, and a third non-display area and a fourth non-display area oppositely arranged along a second direction, the first direction intersecting the second direction; a first electrode connection structure at least in the third non-display area and/or the fourth non-display area; and a first area running through the display panel along the first direction, and the first electrode connection structure being outside the first area.

Another aspect of the present disclosure provides a display device including a display panel. The display panel includes: a non-display area including a first non-display area and a second non-display area oppositely arranged along a first direction, and a third non-display area and a fourth non-display area oppositely arranged along a second direction, the first direction intersecting the second direction; a first electrode connection structure at least in the third non-display area and/or the fourth non-display area; and a first area running through the display panel along the first direction, and the first electrode connection structure being outside the first area Other aspects of the present disclosure can be understood by a person skilled in the art in light of the description, the claims, and the drawings of the present disclosure.

BRIEF DESCRIPTION OF THE DRAWINGS

Accompanying drawings, which are incorporated in and constitute a part of the present specification, illustrate embodiments of the present disclosure and, together with descriptions, serve to explain principles of the present disclosure.

DETAILED DESCRIPTION

Various exemplary embodiments of the present disclosure will be described in detail with reference to the accompanying drawings. It should be noted that, unless specifically stated otherwise, a relative arrangement of components and steps, numerical expressions and numerical values set forth in the embodiments do not limit the scope of the present disclosure.

The following description of at least one exemplary embodiment is merely illustrative and is not intended to limit the present disclosure and application or use thereof.

Techniques, methods, and apparatus known to a person skilled in the art may not be discussed in detail, but where appropriate, such techniques, methods, and apparatus should be considered as part of the present specification.

In all examples shown and discussed herein, any specific value should be construed as illustrative only and not as a limitation. Accordingly, other examples of exemplary embodiments may have different values.

It should be noted that similar numerals and letters refer to similar items in the following accompanying drawings. Once an item is defined in one accompanying drawing, it does not require further discussion in subsequent accompanying drawings.

It will be apparent to a person skilled in the art that various modifications and variations can be made in the present disclosure without departing from the spirit or scope of the present disclosure. Accordingly, the present disclosure is intended to cover the modifications and variations of the present disclosure that fall within the scope of corresponding claims (claimed technical solutions) and equivalents thereof. It should be noted that, implementations provided in the embodiments of the present disclosure may be combined with each other if there is no contradiction.

Figure 2:
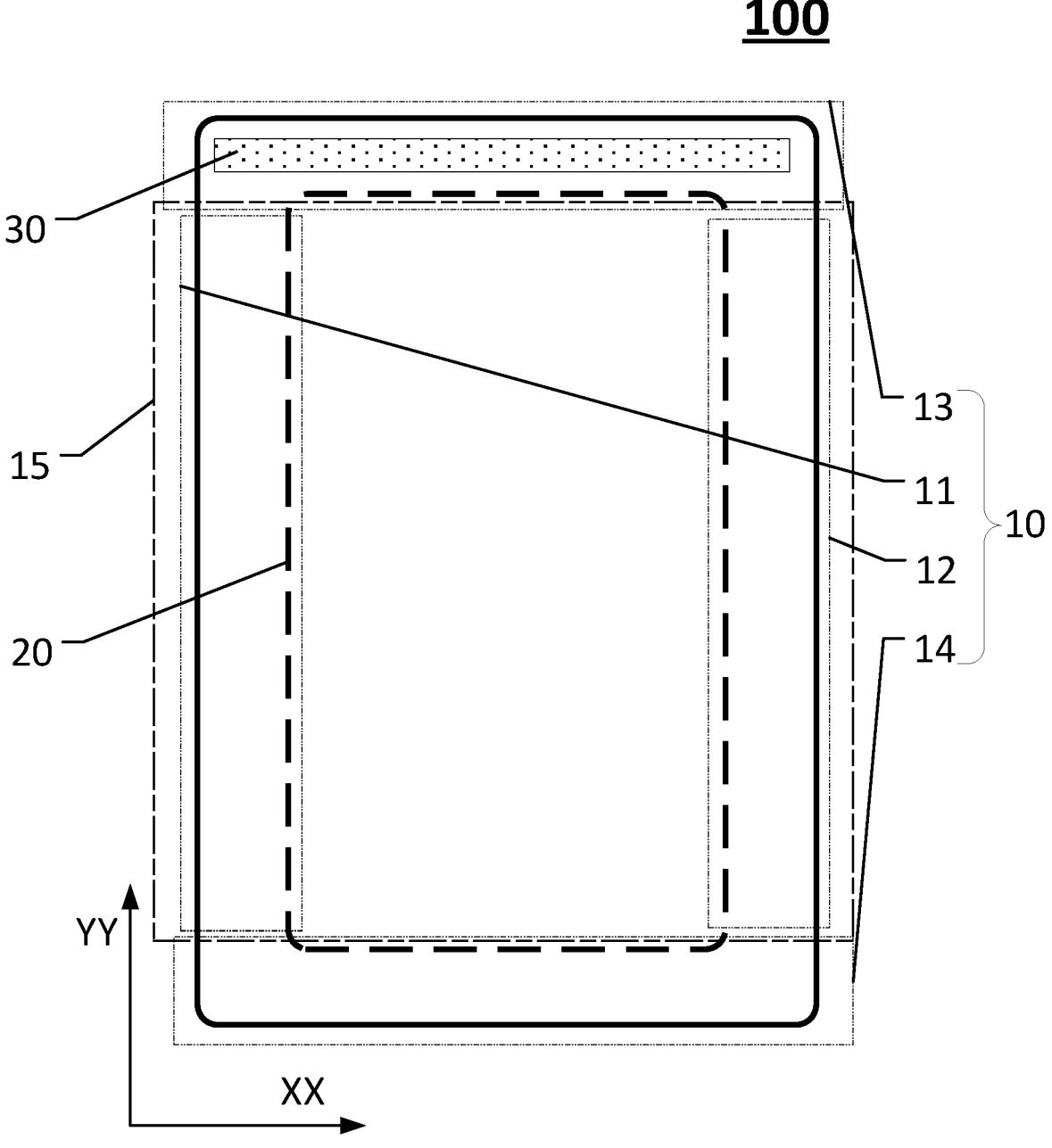
FIG. 2 illustrates a top view of a display panel consistent with various embodiments of the present disclosure.
Figure 3:
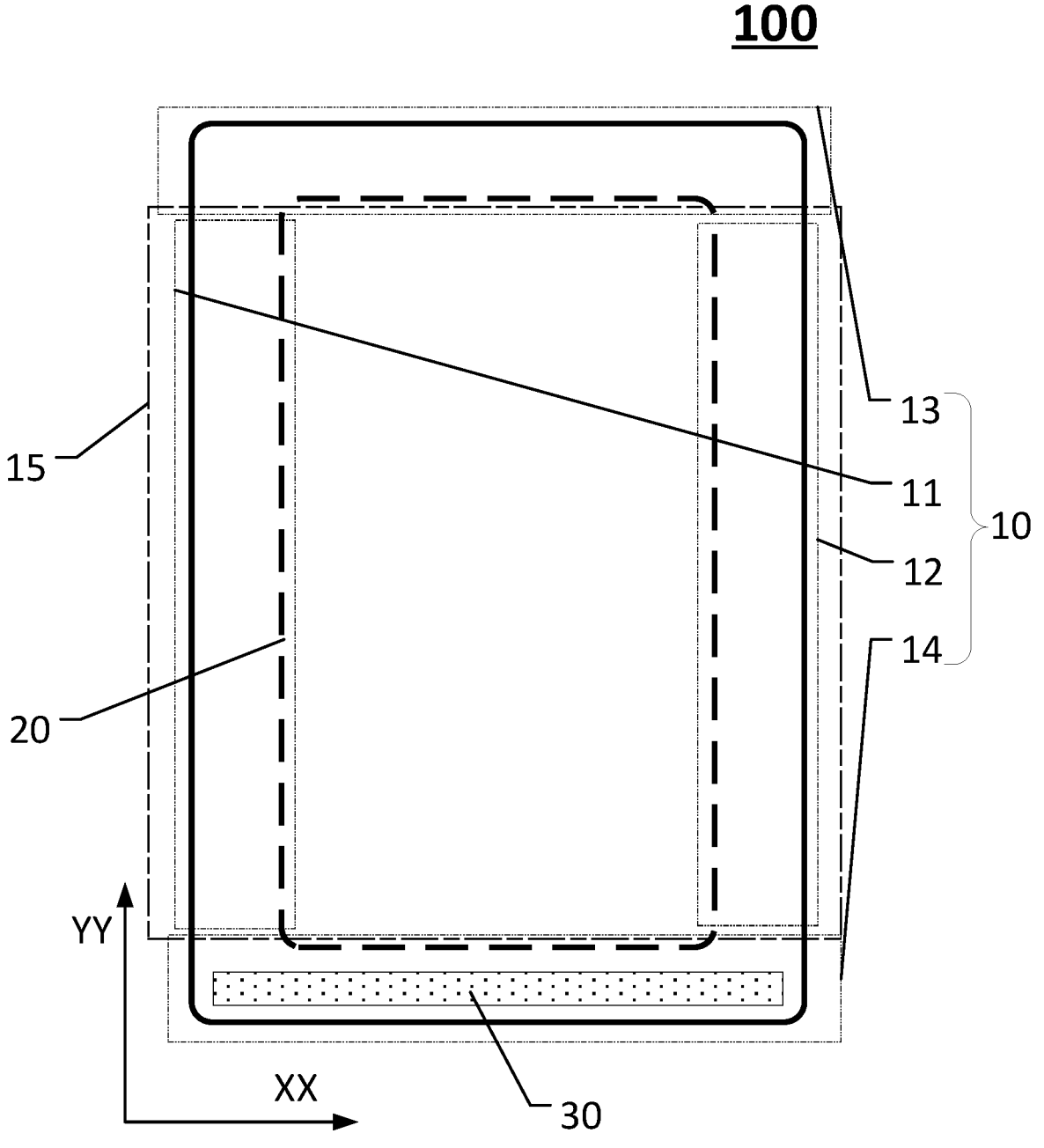
FIG. 3 illustrates another top view of a display panel consistent with various embodiments of the present disclosure.
Figure 4:
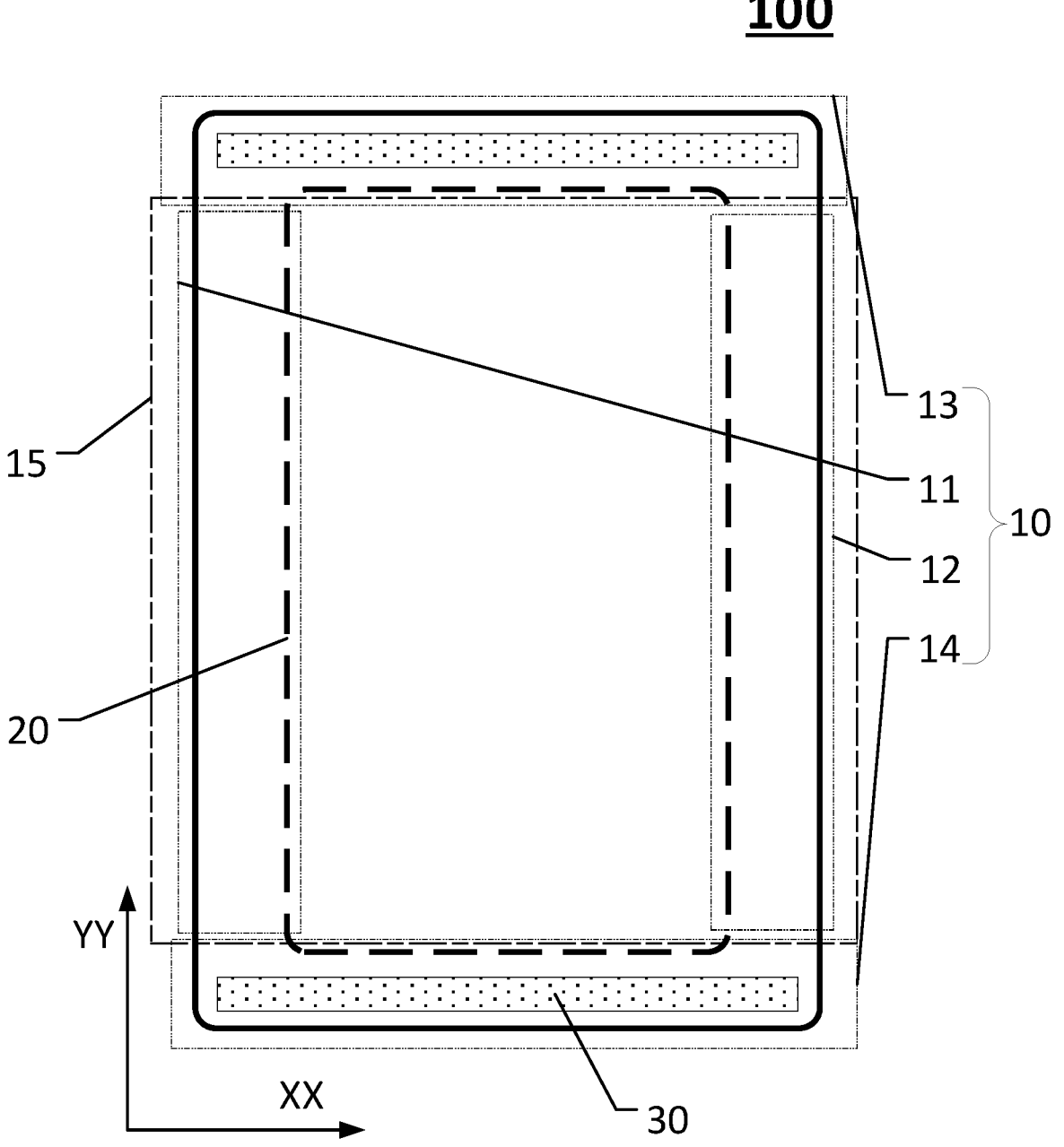
FIG. 4 illustrates another top view of a display panel consistent with various embodiments of the present disclosure.

FIG. 2 illustrates a top view of a display panel consistent with various embodiments of the present disclosure. FIG. 3 illustrates another top view of a display panel consistent with various embodiments of the present disclosure. FIG. 4 illustrates another top view of a display panel consistent with various embodiments of the present disclosure.

Referring to FIGS. 2-4, in one embodiment, a display panel 100 includes a non-display area 10 including a first non-display area 11 and a second non-display area 12 oppositely arranged along a first direction XX, a third non-display area 13 and a fourth non-display area oppositely arranged along a second direction YY, and the first direction XX intersecting the second direction YY; a first electrode connection structure 30 at least in the third non-display area 13 and/or the fourth non-display area 14; and a first area 15 running through the display panel 100 along the first direction XX, and the first electrode connection structure 30 being outside the first area 15.

Figure 1:
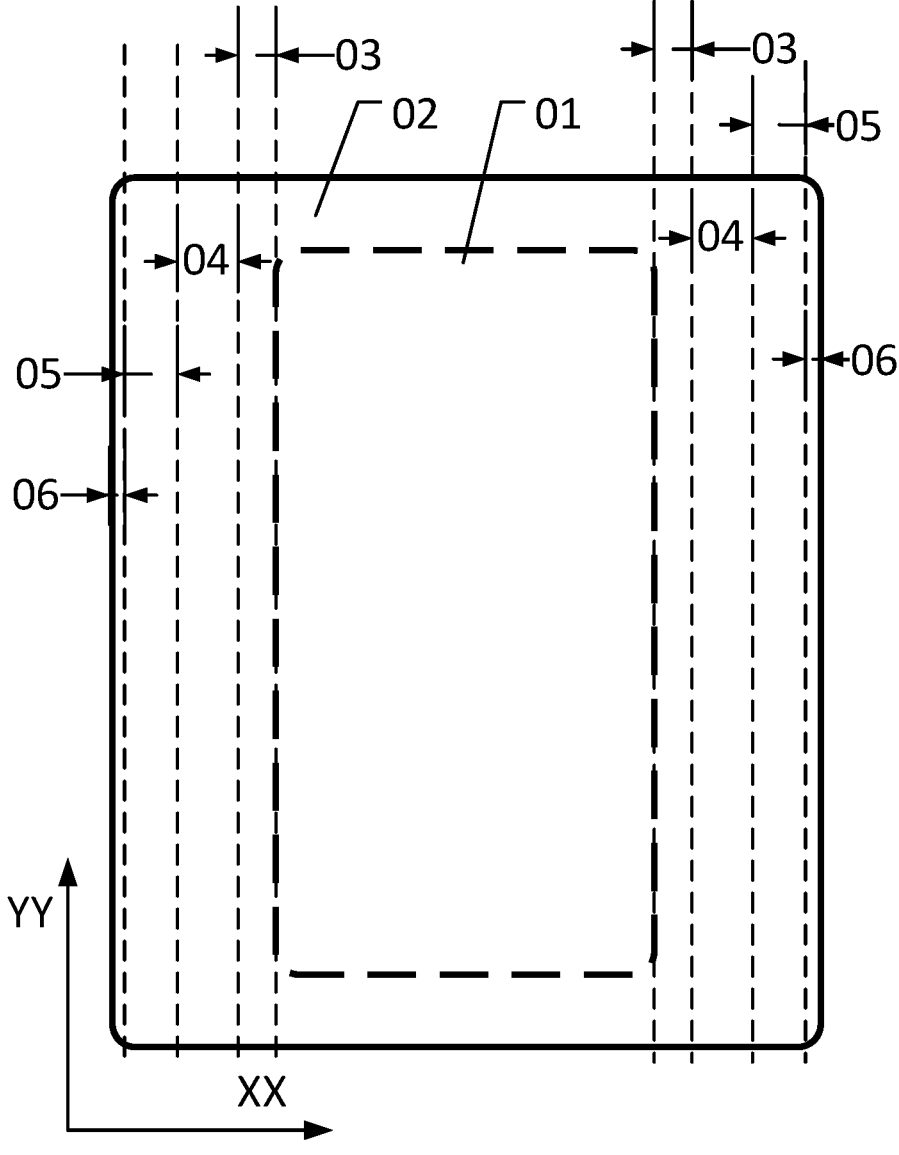
FIG. 1 illustrates a schematic diagram of a display panel.

In the art, for example, when the display panel is a rectangular display panel as shown in FIG. 1, non-display areas 02 in the display panel are not configured for displaying images but can be configured for arranging circuits and components required to drive the display area 01 to display images. The non-display areas 02 may include the first non-display area and the second non-display area arranged oppositely on two sides of the display area 01 along the first direction XX. The non-display areas 02 may also include the third non-display area and the fourth non-display area oppositely arranged along the second direction YY. As shown in FIG. 1, the first non-display area and the second non-display area can be configured for arranging the shift register circuit areas 03, the power signal wiring areas 04, the packaging areas 05, the cutting lines 06, and the like, and the third non-display area and the fourth non-display area can be configured for arranging driver chips, flexible circuit boards, multiplexing circuits, electrostatic protection circuits and the like, which are not limited herein. Users can adjust arrangements of related circuits and components in the non-display areas of the display panel according to needs.

The display panel 100 provided by the present disclosure may include a display area 20 and a non-display area 10. In one optional embodiment, the non-display area 10 can be arranged to surround the display area 20. Taking the display panel 100 being a rectangular display panel as an example, the non-display area 10 in the display panel 100 may include the first non-display area 11 and the second non-display area 12 oppositely arranged on two sides of the display area 20 along the first direction XX, and the third non-display area 13 and the fourth non-display area 14 oppositely arranged on two sides of the display area 20 along the second direction YY. Specifically, the first direction XX intersects the second direction YY perpendicularly. As shown in FIG. 2, the first electrode connection structure 30 can be arranged in the third non-display area 13; or as shown in FIG. 3, the first electrode connection structure 30 can be arranged in the fourth non-display area 14; or as shown in FIG. 4, part of the first electrode connection structure 30 can be arranged in the third non-display area 13 and part of the first electrode connection structure 30 can be arranged in the fourth non-display area 14. In the art, a corresponding first electrode connection structure 30 is arranged in the power signal wiring areas 04 shown in FIG. 1. That is, in the art, the first electrode connection structure occupies a position of the non-display area 02 arranged relatively along the first direction XX in a display product, resulting in a large area occupied by the left and right frames of the display product. For a display panel in the art, there is no compression space for the left and right frames. However, part of a redundant space can be squeezed out in the non-display area 02 oppositely arranged along the second direction YY without expanding an area of the non-display area 10 oppositely arranged along the second direction YY, there is still a space to accommodate some other structural components. Therefore, as shown in FIGS. 2-4, the present disclosure chooses to arrange at least part of the first electrode connection structure 30 to the third non-display area 13 and/or the fourth non-display area 14 arranged along the second direction YY, thereby reducing occupied spaces for the power signal wiring areas 04 in the non-display areas 02 along the first direction XX in the art, so that the non-display area 10 only includes corresponding shift register circuit areas 03, packaging areas 05, and cutting lines 06 in FIG. 1, thereby reducing a required area of the non-display area 10 along the first direction XX, and further narrowing an area of the non-display area 10 in the display panel 100, which is conducive to further realizing a narrow frame design of the display panel 100.

In addition, the display panel 100 includes a first area 15 running through the display panel 100 along the first direction XX, which may be an area occupied by at least part of the display area 20 along the first direction XX and the first non-display area 11 and the second non-display area 12 arranged outside the display area 20 along the first direction XX. In the art, taking a rectangular display panel as an example, there may be redundant spaces on upper and lower sides of the display panel to add some structural components. Therefore, to reduce areas of the non-display areas corresponding to the left and right frames of the display panel, the first electrode connection structure 30 can be arranged outside the first area 15. Therefore, the first electrode connection structure can be arranged without occupying areas of the left and right frames in the art, specifically, an area occupied by the corresponding power signal wiring area 04 in the art is reduced. Therefore, as shown in FIGS. 2-4, the first electrode connection structure 30 is arranged in the third non-display area 13 and/or the fourth non-display area 14 in the display panel 100, which can not only ensure a large enough installation area of the first electrode connection structure 30 for electrical signal transmissions and ensure a normal operation of the display panel 100, but also avoid an area occupation of the first non-display area 11 and/or the second non-display area 12 by arranging the first electrode connection structure 30 in the display panel 100, to narrow required areas of the first non-display area 11 and/or the second non-display area 12, and to further narrow the area of the non-display area 10 in the display panel 100, which is conducive to further realizing a narrow frame design of the display panel 100.

It should also be noted that, in the embodiments shown in FIGS. 2-4, the first electrode connection structure 30 occupies most of the areas of the third non-display area 13 and/or the fourth non-display area 14, which is only one optional arrangement provided by the present disclosure and not limited herein. Users can arrange the first electrode connection structure 30 to only occupy part of the third non-display area 13 and/or the fourth non-display area 14 according to needs, as long as the first electrode connection structure 30 can be guaranteed to maintain original functions thereof to ensure a normal operation of the display panel 100.

It should also be noted that the present disclosure does not limit number of microstructures included in the first electrode connection structure 30 in the display panel 100. That is, the first electrode connection structure 30 can be composed of a plurality of microstructures according to needs and can also be configured as an integral structure according to needs. Users can adjust physical properties such as shape, type, number of microstructures, and materials of the first electrode connection structure 30 according to needs.

It should also be noted that, types of electrical signals used by the first electrode connection structure 30 in the display panel 100 are not specifically limited herein. Users can move components originally arranged in the power signal wiring areas for transmitting electrical signals to redundant spaces in the third non-display area 13 and/or the fourth non-display area 14 according to needs, as long as required areas of the first non-display area 11 and/or the second non-display area 12 can be reduced without increasing areas of the third non-display area 13 and the fourth non-display area 14, to narrow the entire area of the non-display area 10 in the display panel 100.

Figure 5:
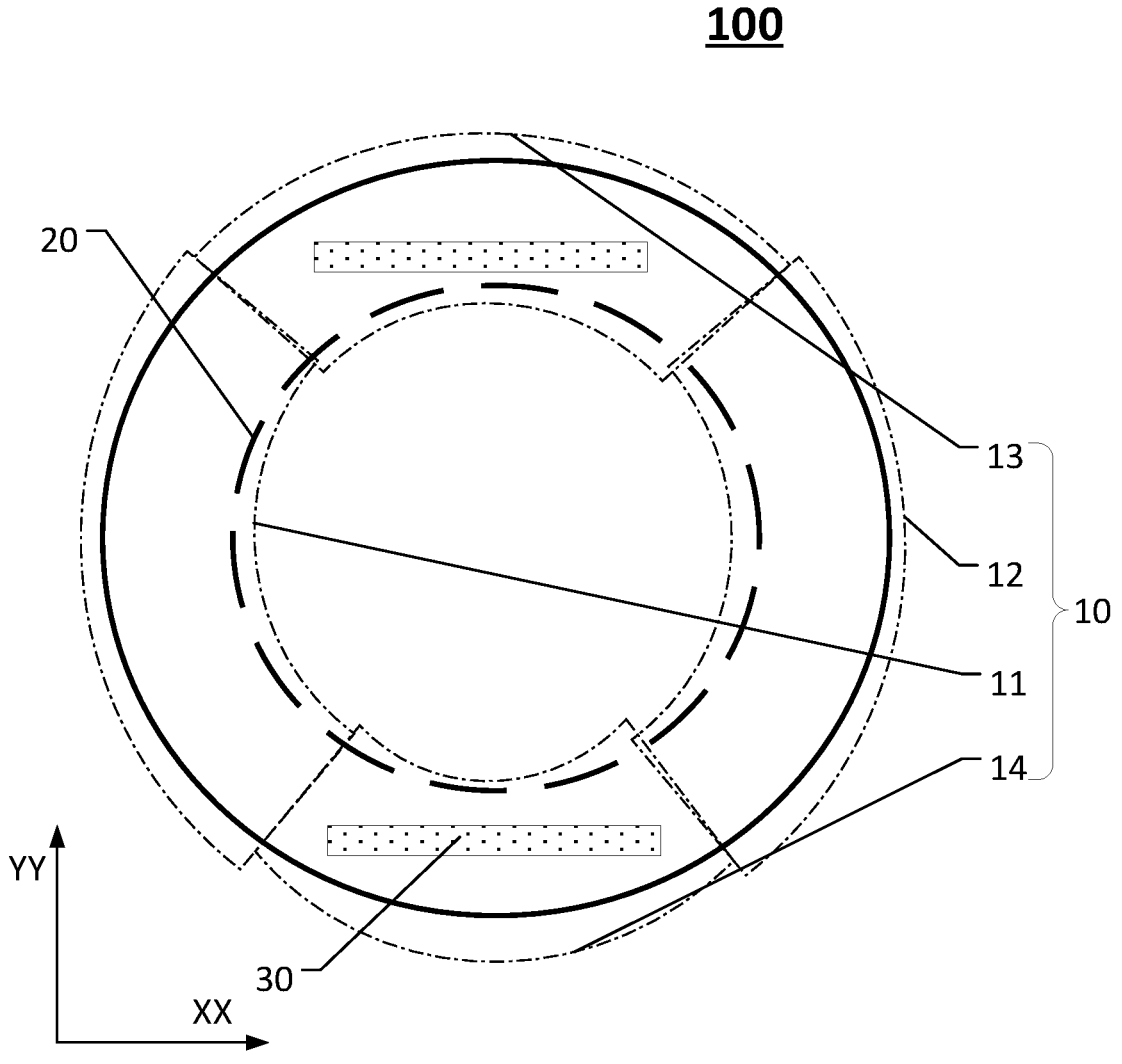
FIG. 5 illustrates another top view of a display panel consistent with various embodiments of the present disclosure.

In addition, it should be noted that, the present disclosure takes the rectangular display panel 100 as an example only to illustrate that the first electrode connection structure 30 in a display product can be moved to redundant spaces in the non-display area 10, and is not intended to limit a technical solution of moving the first electrode connection structure 30 to the redundant spaces in the non-display area 10 that can only be used for a rectangular display panel 100. FIG. 5 illustrates another top view of a display panel consistent with various embodiments of the present disclosure. When the display panel 100 is a circular display panel 100, similarly, the non-display area 10 in the display panel 100 can also be divided into the first non-display area 11, the second non-display area 12 along the intersecting first direction XX and the third non-display area 13 and the fourth non-display area 14 along the second direction YY. In the art, the first electrode connection structure is originally arranged in the first non-display area 11 and/or the second non-display area 12 in the circular display panel. In the present disclosure, the first electrode connection structure 30 can be moved to redundant spaces in other non-display areas such as the third non-display area 13 and/or the fourth non-display area 14 to reduce the entire area of the non-display area 10 in the display panel 100.

Figure 6:
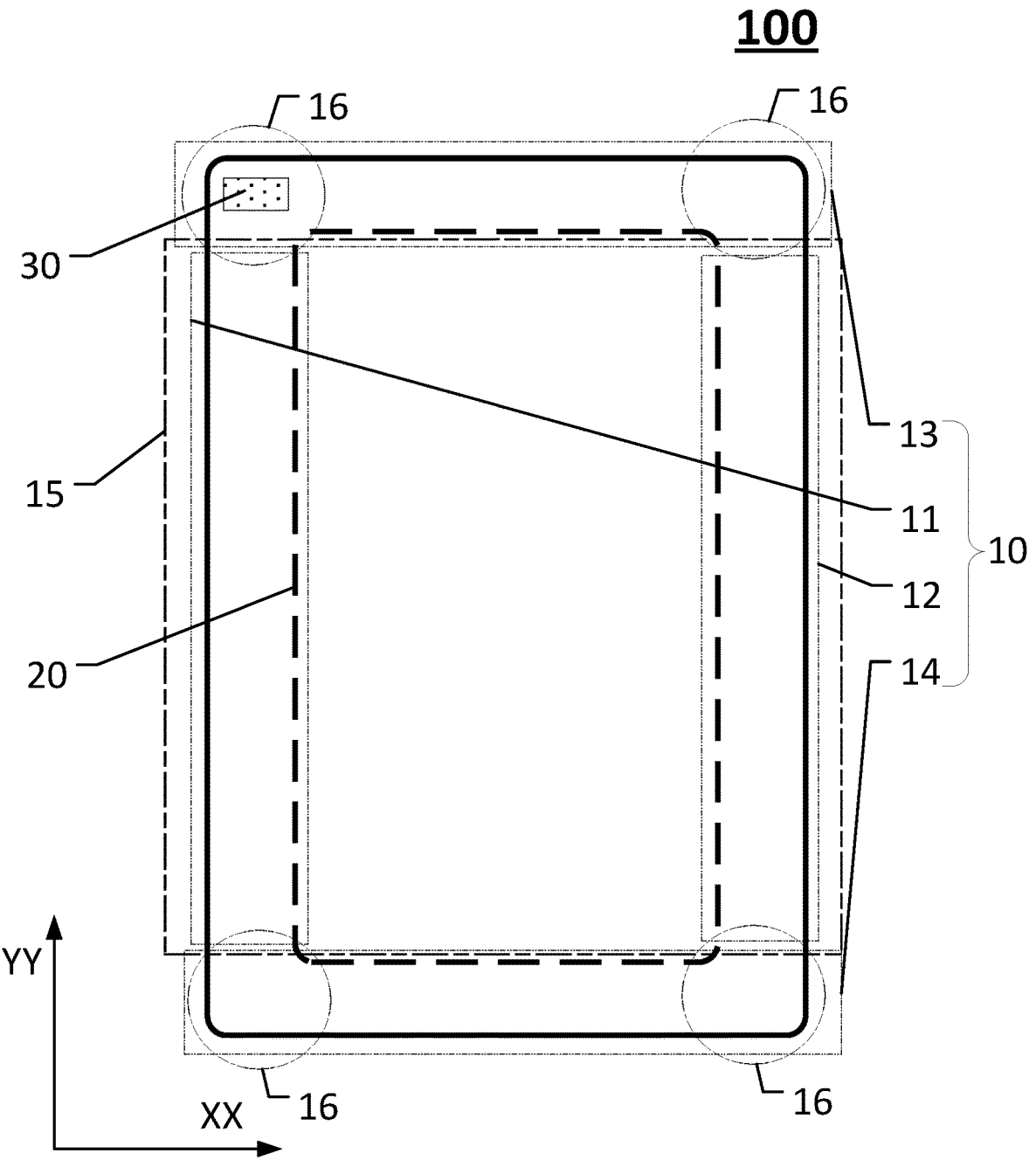
FIG. 6 illustrates another top view of a display panel consistent with various embodiments of the present disclosure.
Figure 7:
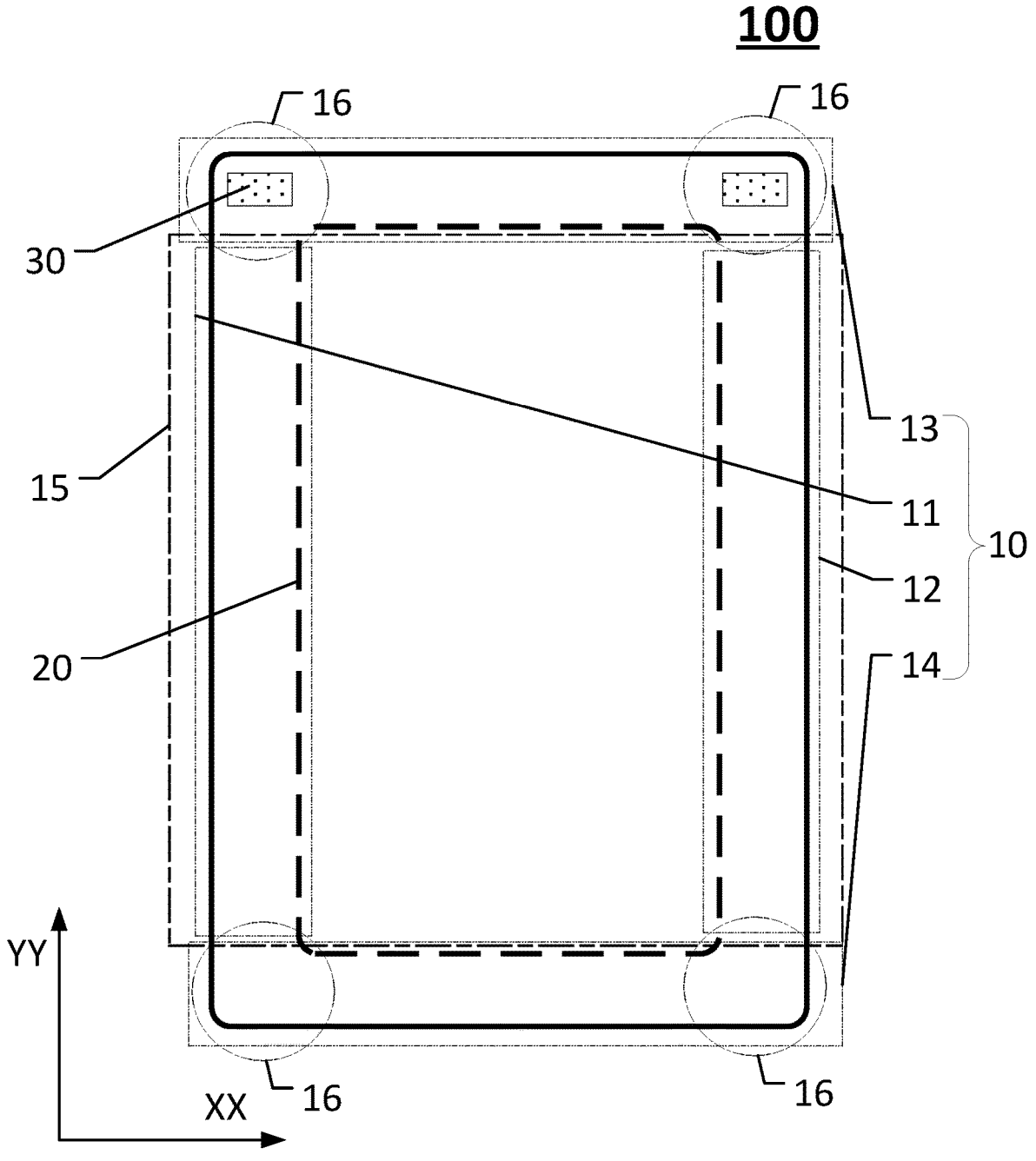
FIG. 7 illustrates another top view of a display panel consistent with various embodiments of the present disclosure.
Figure 8:
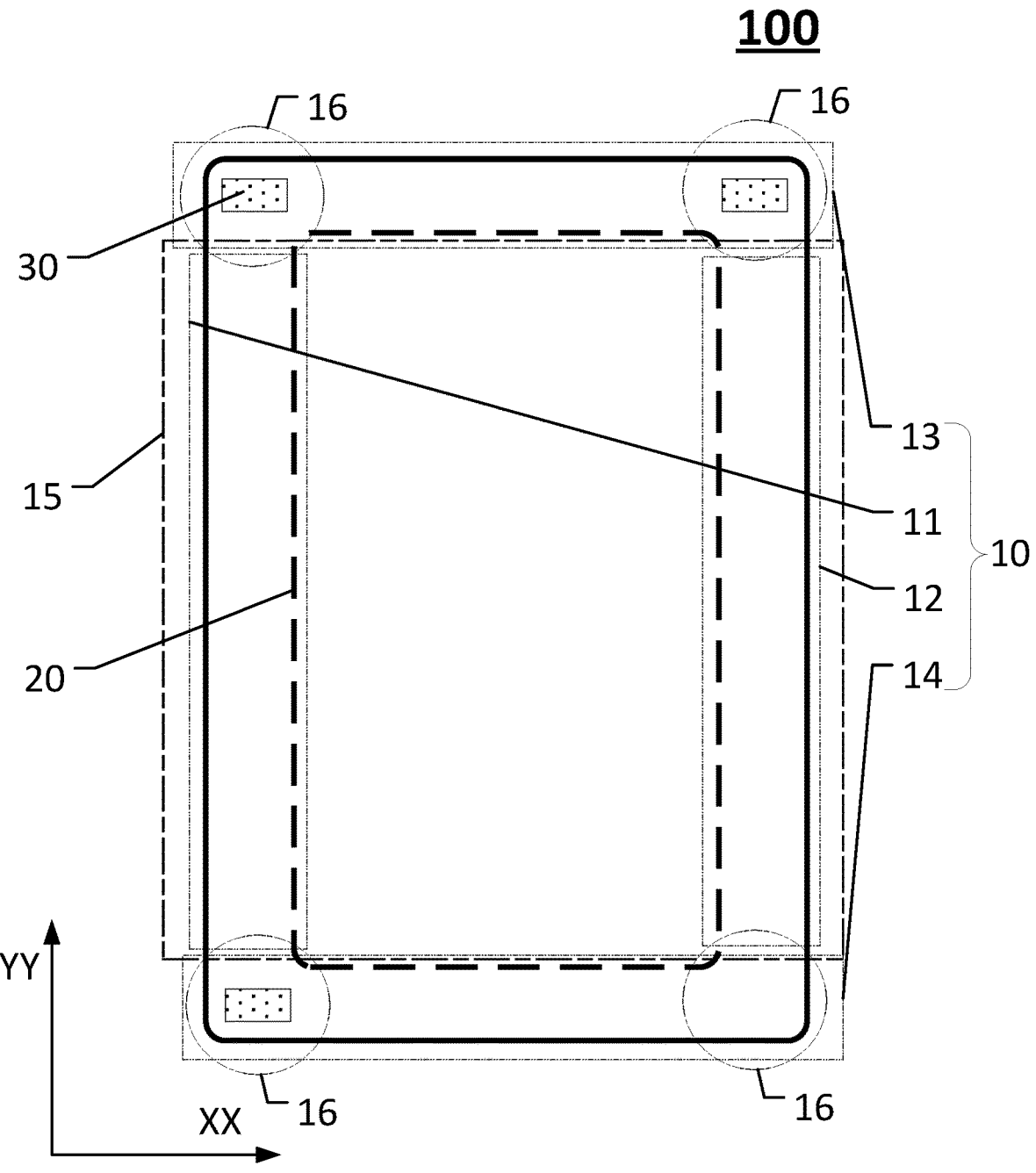
FIG. 8 illustrates another top view of a display panel consistent with various embodiments of the present disclosure.
Figure 9:
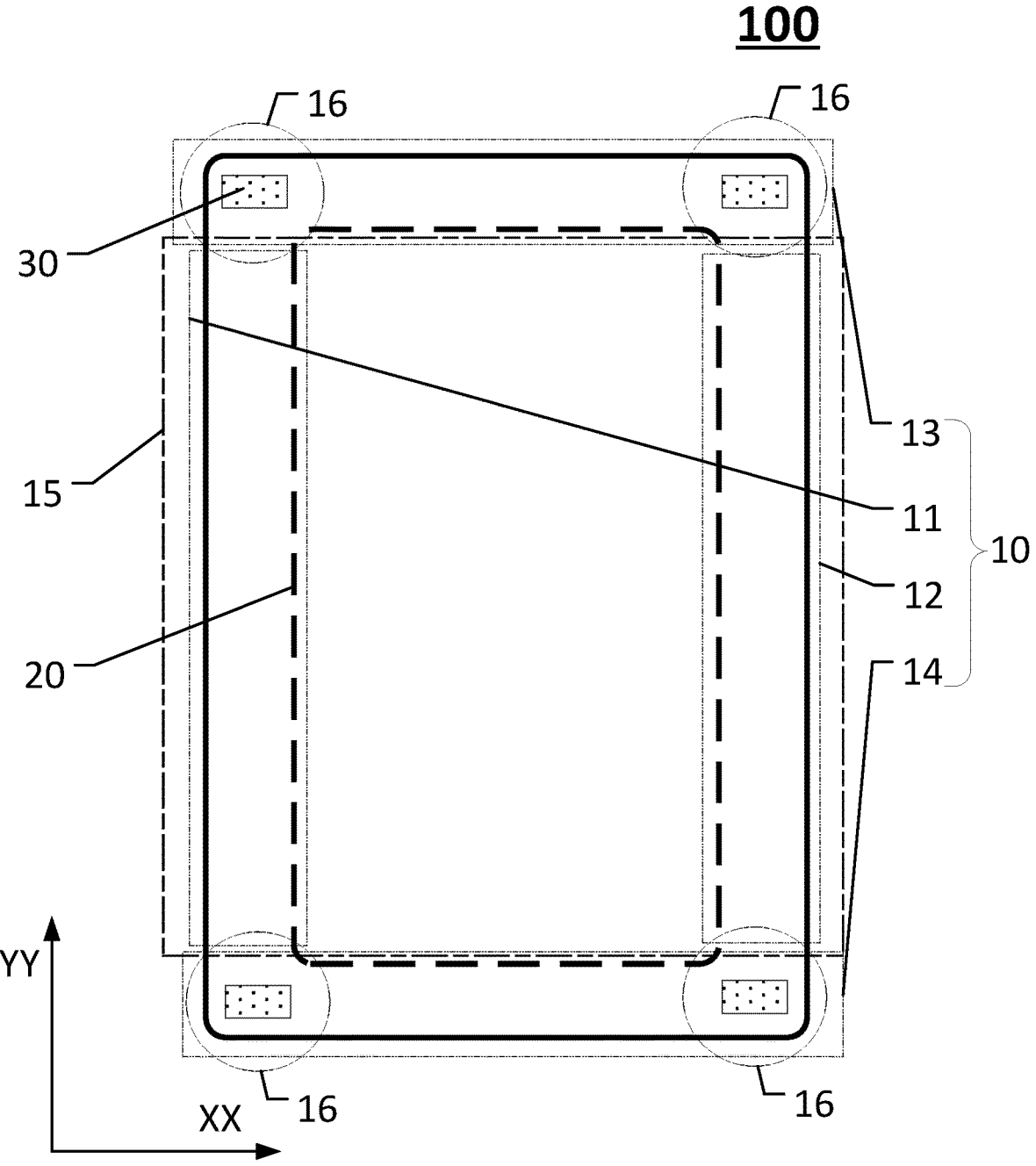
FIG. 9 illustrates another top view of a display panel consistent with various embodiments of the present disclosure.

FIG. 6 illustrates another top view of a display panel consistent with various embodiments of the present disclosure. FIG. 7 illustrates another top view of a display panel consistent with various embodiments of the present disclosure. FIG. 8 illustrates another top view of a display panel consistent with various embodiments of the present disclosure. FIG. 9 illustrates another top view of a display panel consistent with various embodiments of the present disclosure. Referring to FIGS. 6-9, optionally, the non-display area 10 includes corner areas 16, and at least part of the first electrode connection structure 30 is in the corner areas 16.

It should be noted that, in the art, redundant spaces corresponding to four corners in a rectangular display product are relatively large. Central areas of the non-display area oppositely arranged along the second direction YY also has spaces that can be narrowed and utilized, which are smaller than the spaces in the corner areas. Optionally, the first electrode connection structure 30 can arranged on at least one of the two ends of the third non-display area 13 in the display panel 100 along the first direction XX, and/or on at least one of the two ends of the fourth non-display area 14 in the display panel 100 along the first direction XX, which can not only reduce the area of the non-display area 10, but also avoid an increase in a forming difficulty of the display panel 100 due to a too small arrangement area of the first electrode connection structure 30 when the first electrode connection structure 30 is arranged oppositely along the second direction YY in the central areas of the non-display area 10, and avoid an increasing stability difficulty of electrical connections between the first electrode connection structure 30 and other structural components, to ensure a stability need of electrical signal transmissions when the display panel 100 works normally.

Therefore, taking the display panel 100 being a rounded rectangular display panel as an example, the non-display area 10 may include four corner areas 16. Referring to the above, compared with four rectangular non-display areas in the non-display area 10 corresponding to the up, down, left, and right sides of the display area 20, redundant spaces in the corner areas 16 in a rounded rectangular display panel 100 are relatively larger. Therefore, the first electrode connection structure 30 can be moved to the corner areas 16, which can also reduce an occupied space of the power signal wiring area in the non-display area along the first direction XX in the art, thereby reducing the required area of the non-display area 10 in the first direction XX and further narrowing the area of the non-display area 10 in the display panel 100, which is conducive to further realizing a narrow frame design of the display panel 100.

It should be noted that, the present disclosure does not limit that every corner area 16 needs to be arranged with the first electrode connection structure 30. Users can occupy number of corner areas 16 according to needs. For example, when a rectangular display panel 100 includes four corner areas 16, as shown in FIG. 6 and FIG. 7, one or two of the corner areas 16 can be configured for arranging the first electrode connection structure 30, as shown in FIG. 8 and FIG. 9, three or all the corner areas 16 can be configured for arranging the first electrode connection structure 30.

In addition, taking a rounded rectangular non-display area 10 including four corner areas 16 as an example to describe an arrangement of the first electrode connection structure 30 is only one optional embodiment provided by the present disclosure and is not intended to limit technical solutions only to the display panel 100 including a rounded rectangle in the present disclosure. For example, a right-angled rectangular display panel 100 can also utilize at least part of the corner areas 16 for arranging the first electrode connection structure 30. Similarly, a display panels 100 of another shape can also utilize part of the corner areas 16 for arranging the first electrode connection structure 30 as long as the first electrode connection structure 30 is arranged at positions with redundant spaces in the non-display area 10 in the display panel 100 to avoid occupying areas where the first electrode connection structures are originally arranged in the display panel in the art, and to achieve an effect of reducing spaces occupied by the non-display area 10 in the display panel 100.

Figure 10:
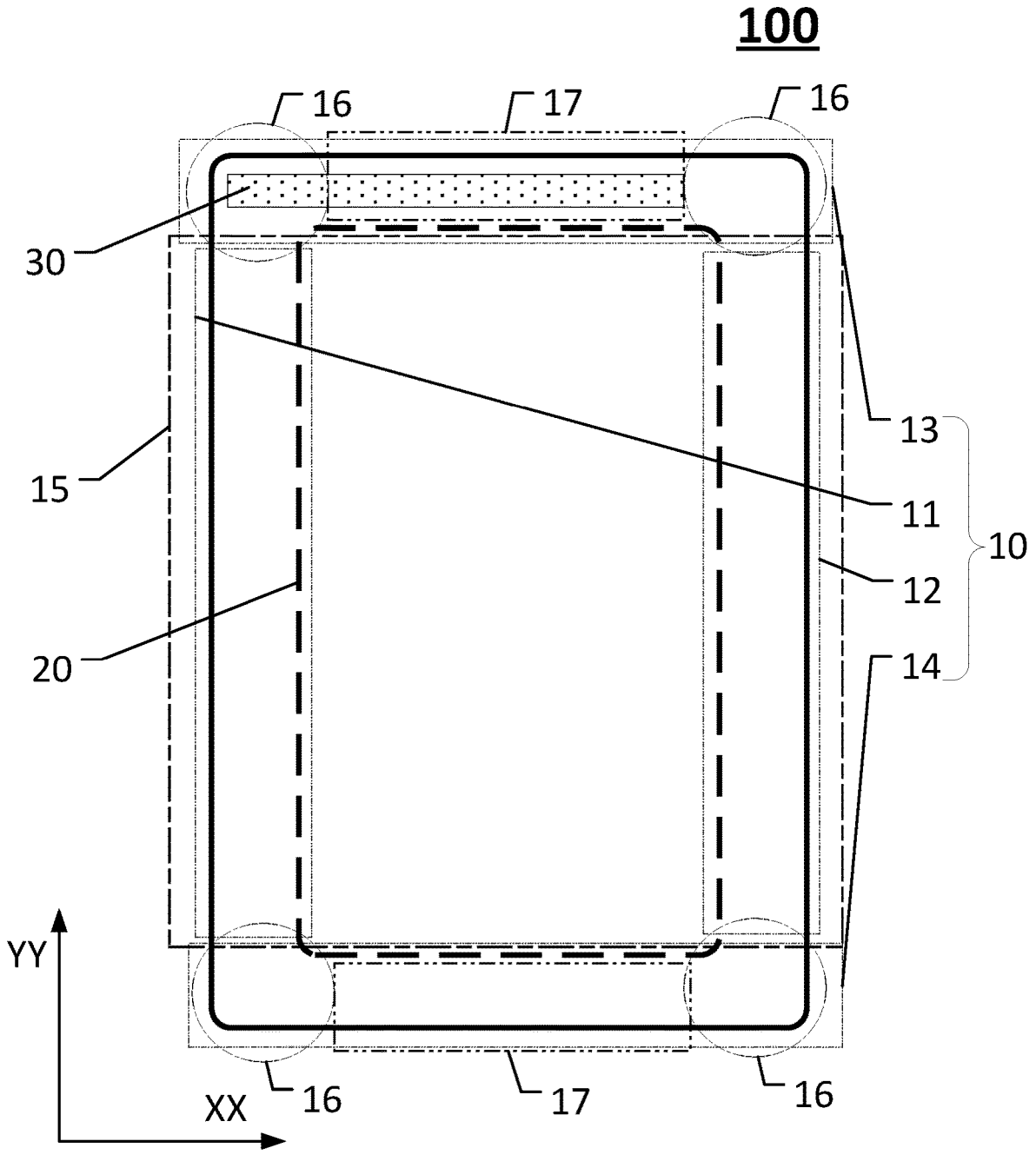
FIG. 10 illustrates another top view of a display panel consistent with various embodiments of the present disclosure.
Figure 11:
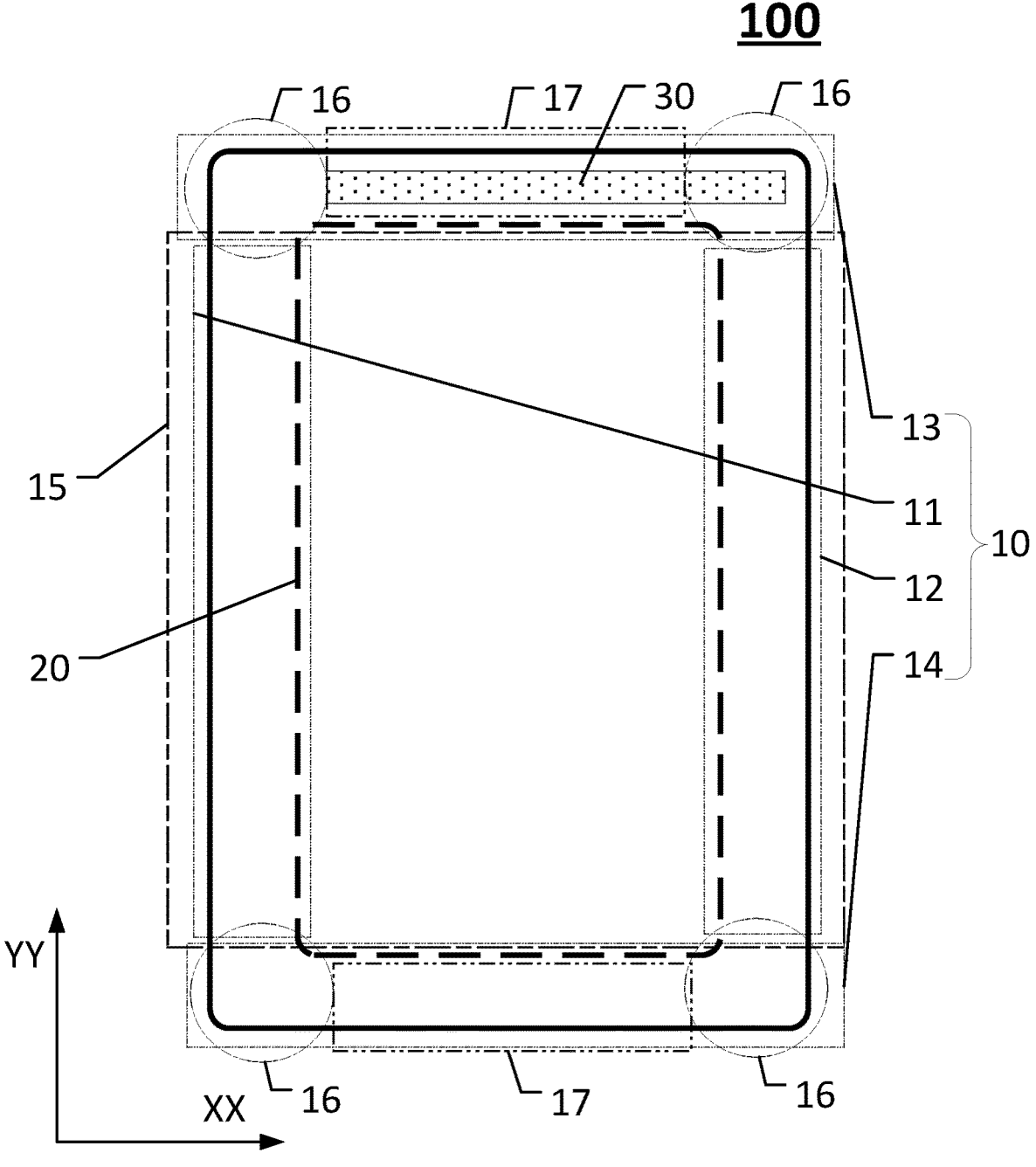
FIG. 11 illustrates another top view of a display panel consistent with various embodiments of the present disclosure.
Figure 12:
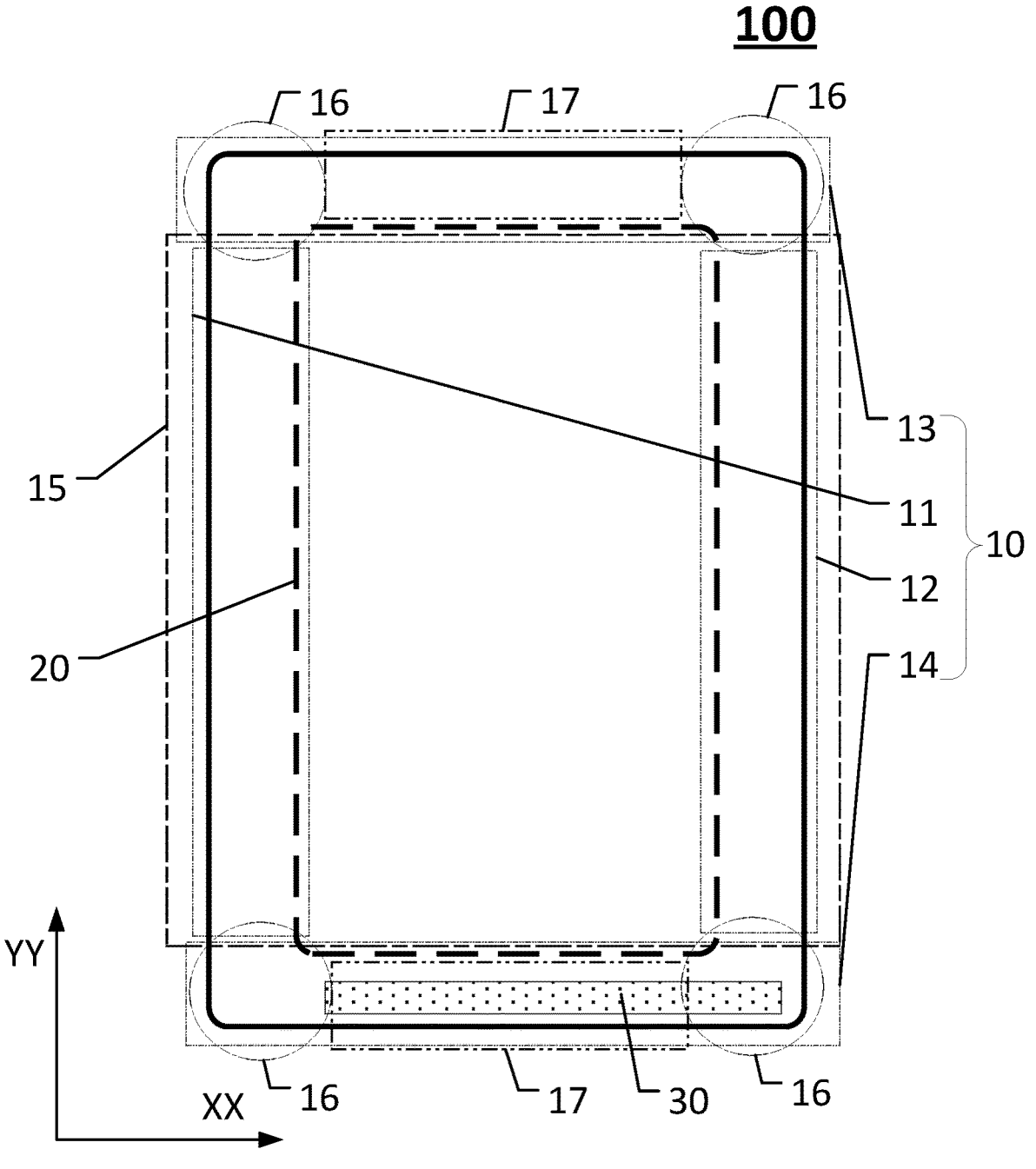
FIG. 12 illustrates another top view of a display panel consistent with various embodiments of the present disclosure.
Figure 13:
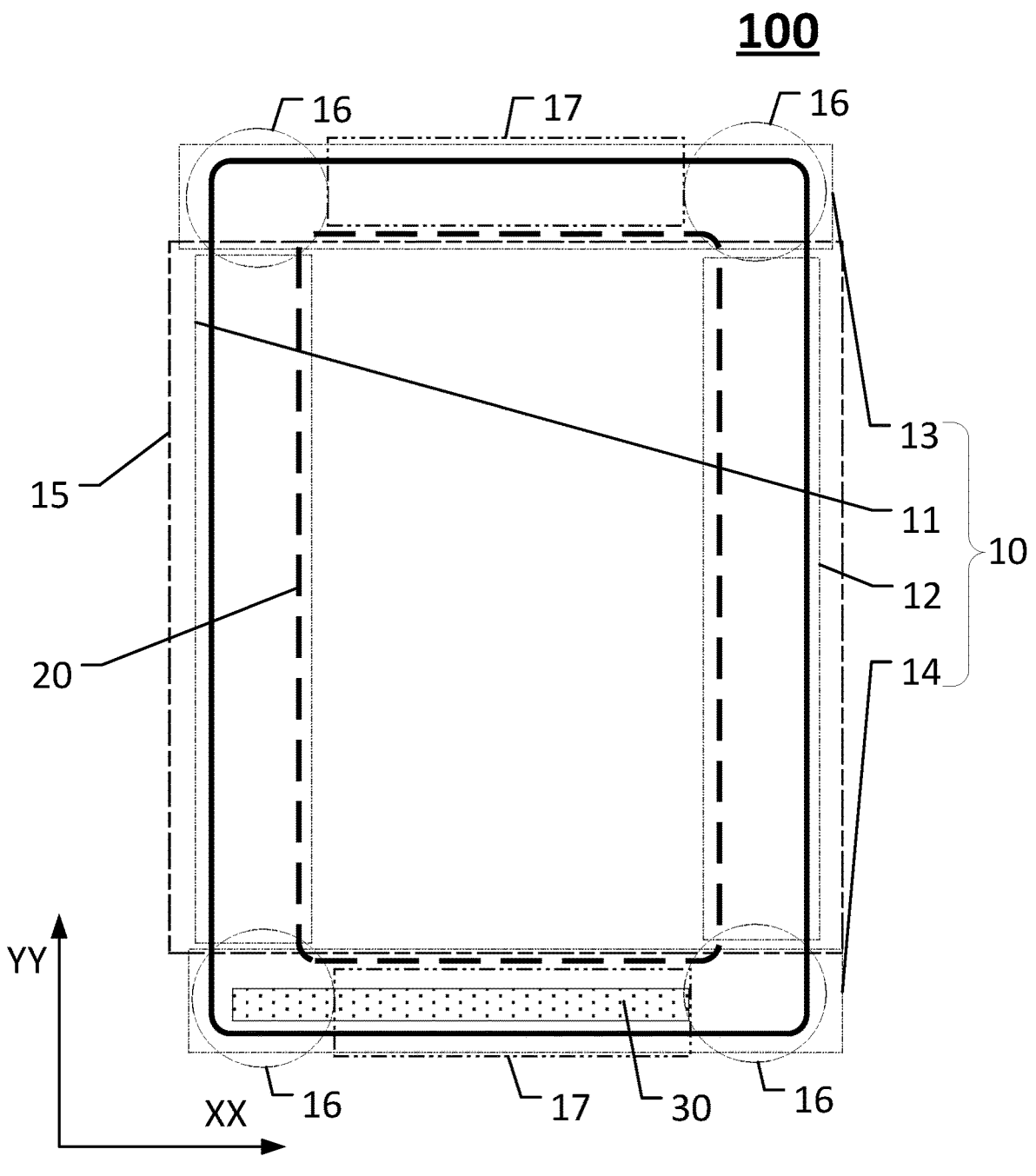
FIG. 13 illustrates another top view of a display panel consistent with various embodiments of the present disclosure.

FIG. 10 illustrates another top view of a display panel consistent with various embodiments of the present disclosure. FIG. 11 illustrates another top view of a display panel consistent with various embodiments of the present disclosure. FIG. 12 illustrates another top view of a display panel consistent with various embodiments of the present disclosure. FIG. 13 illustrates another top view of a display panel consistent with various embodiments of the present disclosure. Referring to FIGS. 2-4 and FIGS. 10-13, optionally, the non-display area 10 include corner areas 16 and second areas 17, each of which connects two corner areas 16. The first electrode connection structure 30 runs through the second areas 17.

As described above, the first electrode connection structures in the art may occupy positions of the non-display area 10 relatively arranged along the first direction XX in a display product, resulting in large areas occupied by left and right frames of the display product. For a display panel in the art, the left and right frames have no spaces to be narrowed. However, part of redundant spaces can be spared in the non-display areas oppositely arranged along the second direction YY without expanding the areas of the non-display area oppositely arranged along the second direction YY to accommodate other structural components. Therefore, in one optional embodiment, as shown in FIGS. 10-13, taking a display panel 100 being a rounded rectangular display panel as an example, the non-display area 10 may include four corner areas 16. Along the first direction XX of the first non-display area 11 pointing to the second non-display area 12, the non-display area 10 can be arranged to include second areas 17, each of which is connected to two corner areas 16 arranged along the first direction XX. The first electrode connection structure 30 can be arranged at least running through the second areas 17, that is, at least part of the third non-display area 13 and/or the fourth non-display area 14 in the display panel 100 can be used to arrange the first electrode connection structure 30.

Specifically, as shown in FIGS. 10-13, the first electrode connection structure 30 may also be arranged in a second area 17 and in at least one corner area 16 of the two corner areas 16 adjacent to the second area. For example, as shown in FIG. 10, the first electrode connection structure 30 can be arranged in a second area 17 in the third non-display area 13 and in a corner area 16 facing a side of the first non-display area 11. For example, as shown in FIG. 11, alternatively, the first electrode connection structure 30 can be arranged in a second area 17 in the third non-display area 13 and in a corner area 16 facing a side of the second non-display area 12. Similarly, as shown in FIG. 12 and FIG. 13, the first electrode connection structure 30 may also be in a second area 17 in the fourth non-display area 14 and at least one corner area 16 adjacent to the second area 17. In addition, the first electrode connection structure 30 may also be in the entire third non-display area 13 and/or fourth non-display area 14. As shown in FIG. 2, the first electrode connection structure 30 can be arranged in the entire third non-display area 13. As shown in FIG. 3, the first electrode connection structure 30 can be arranged in the entire fourth non-display area 14. As shown in FIG. 4, part of the first electrode connection structure 30 may be arranged in the entire third non-display area 13, and part of the first electrode connection structure 30 may be arranged in the entire fourth non-display area 14.

It should be noted that the present disclosure proposes that the first electrode connection structure 30 can be arranged running through the second areas 17, which is not limited that the first electrode connection structure 30 can only occupy the second areas 17 and can further extend the first electrode connection structure 30 to at least one corner area 16 connected to the second areas 17 and increase an installation area of the first electrode connection structure 30 in the non-display area 10. When other structural components are arranged to be electrically connected to the first electrode connection structure 30, the first electrode connection structure 30 with a larger area can improve a convenience and stability of an electrical connection between the first electrode connection structure 30 and another structural component to ensure that, when the first electrode connection structure 30 is arranged in the second areas 17, or the second area 17 and the adjacent corner area 16, the first electrode connection structure 30 can play a role in the operation of the display panel 100, thereby reducing the overall area of the non-display area 10 in the display panel 100, ensuring a normal operation of the display panel 100, and a use effect of a corresponding display device.

Figure 14:
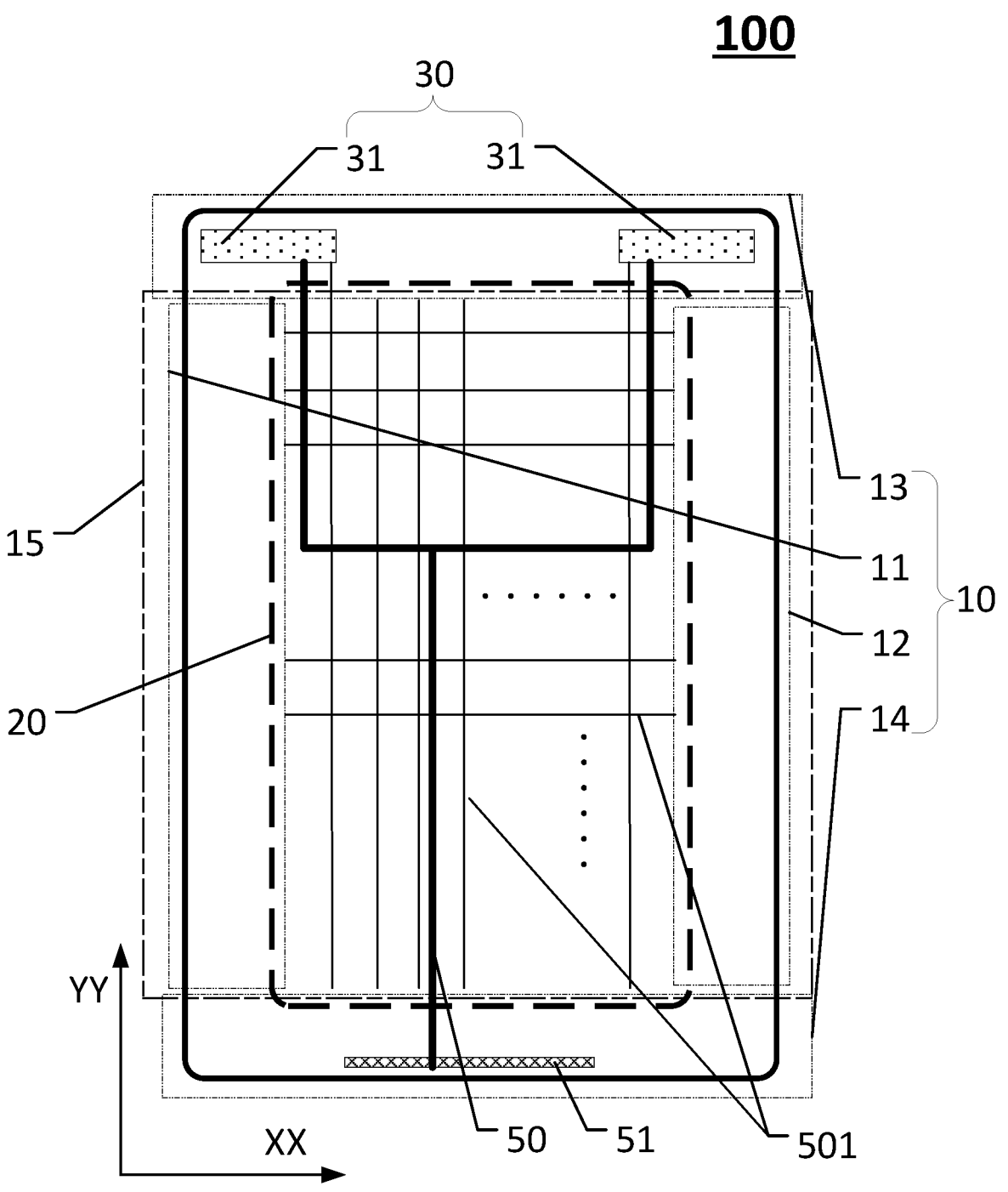
FIG. 14 illustrates another top view of a display panel consistent with various embodiments of the present disclosure.
Figure 15:
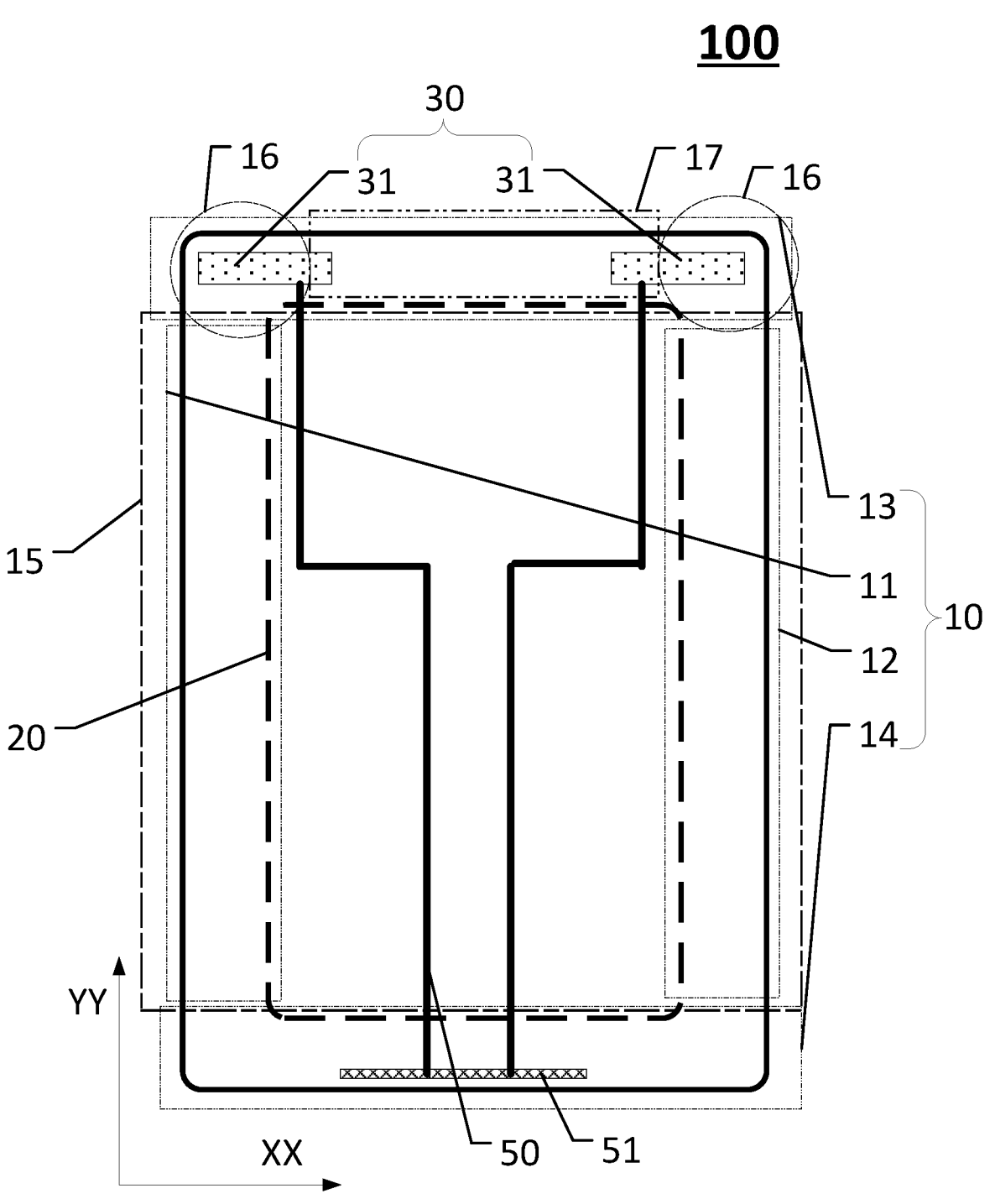
FIG. 15 illustrates another top view of a display panel consistent with various embodiments of the present disclosure.
Figure 16:
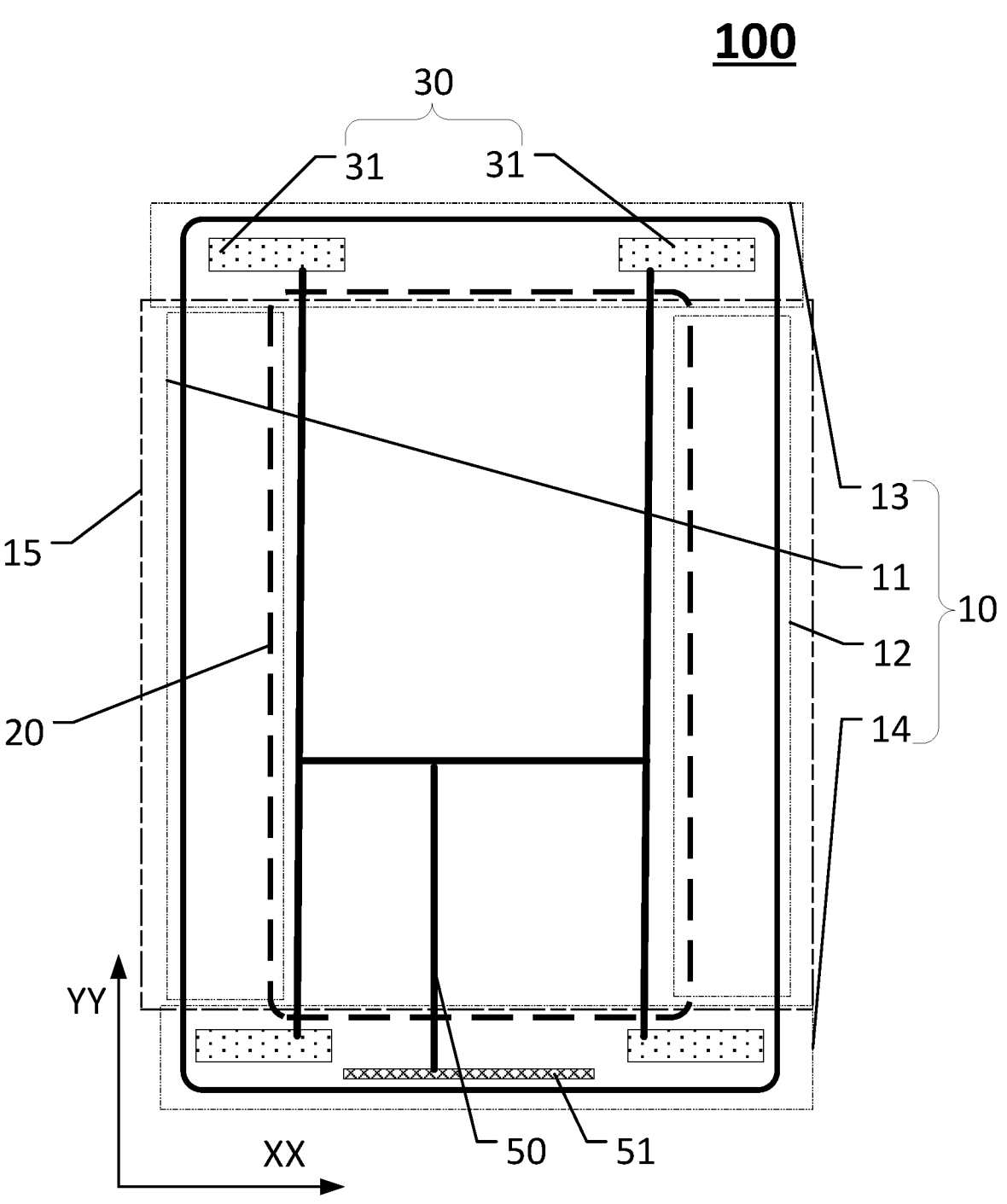
FIG. 16 illustrates another top view of a display panel consistent with various embodiments of the present disclosure.

FIG. 14 illustrates another top view of a display panel consistent with various embodiments of the present disclosure. FIG. 15 illustrates another top view of a display panel consistent with various embodiments of the present disclosure. FIG. 16 illustrates another top view of a display panel consistent with various embodiments of the present disclosure. Referring to FIGS. 14-16, optionally, the display panel further includes a display area 20 including first electrode signal lines 50. The first electrode connection structure 30 is electrically connected to the first electrode signal lines 50.

In one optional embodiment, the display panel 100 also includes a display area 20. For example, the non-display area 10 can be arranged to surround the display area 20. The first electrode signal lines 50 may be arranged in the display area 20, and the first electrode signal line 50 can be configured to be electrically connected to the first electrode connection structure 30 to realize transmissions of electrical signals to the first electrode connection structure 30 through the first electrode signal lines 50. When one end of a first electrode signal line 50 is electrically connected to the first electrode connection structure 30, optionally, another end of the first electrode signal line 50 can be arranged to be electrically connected to a corresponding driving chip 51 of the display panel 100, so that the transmissions of the electrical signals transmitted by the driving chip 51 to the first electrode connection structure 30 can be realized through the first electrode signal line 50.

It should be noted that the present disclosure does not limit types of first electrode signal lines 50, nor does the present disclosure limit types of the electrical signals transmitted by the first electrode signal lines 50. Users can arrange the types of the first electrode signal line s50 and the types of the electrical signals transmitted by the first electrode signal lines 50 according to needs.

In one embodiment, the first electrode signal lines 50 can be a plurality of PVEE signal lines in the display panel 100. The present disclosure can arrange all the PVEE signal lines in the display area 20, to avoid a space occupation in the non-display area 10 by the PVEE signal lines. Compared with an arrangement method of wiring at least part of the PVEE signal lines through the first non-display area and the second non-display area along the first direction XX in the art, the present arrangement can further save the required area of the non-display area 10 for the wiring lines, components, and the like in the display panel 100, thereby reducing an arrangement area of the first non-display area and the second non-display area along the first direction XX in the display panel. One end of a PVEE signal line of part of the PVEE signal lines can be electrically connected to the first electrode connection structure 30 for transmitting electrical signals to the first electrode connection structure 30, and one end of the PVEE signal lines close to the driver chip 51 can be electrically connected to the driver chip 51, thereby receiving a negative power supply signal and realizing signal transmissions, so that the PVEE signal lines can be used to transmit the electrical signals (i.e., PVEE signals and power supply voltage signals) transmitted by the driver chip 51 to the first electrode connection structure 30.

It should be noted that PVEE described herein refers to Pixel VEE. Pixel represents pixel and VEE represents negative voltage, that is, PVEE represents providing a negative voltage to a pixel.

Referring to FIG. 14 and FIG. 16, optionally, the first electrode connection structure 30 includes a plurality of sub-first electrode connection structures 31, and at least two sub-first electrode connection structures 31 are connected in parallel.

In one optional embodiment, the first electrode connection structure 30 in the display panel 100 may be composed of two or more sub-first electrode connection structures 31. When a plurality of sub-first electrode connection structures

31 are arranged in the display panel 100, at least two sub-first electrode connection structures 31 can be arranged to be connected in parallel, which is conducive to reducing an overall impedance of the first electrode connection structure 30, thereby reducing a load of the first electrode connection structure 30 and is also conducive to improving a transmission effect of electrical signals related to the first electrode connection structure 30, and improving a display effect of the display panel 100.

The "two first sub-electrode connection structures 31 are connected in parallel" describe above is specifically, as shown in FIG. 14, that display panel 100 is not only arranged with the first electrode signal lines 50 shown in bold lines for transmitting electrical signals from the driving chip 51 to the sub-first electrode connection structures 31, but also arranged with a plurality of sub-first electrode signal lines 501 shown by thin lines included in the first electrode signal lines 50 for electrically connecting a plurality of first electrode signal lines 50 (including the sub-first electrode signal lines 501) in parallel, to indirectly connect two sub-first electrode connection structures 31 in parallel.

Referring to FIG. 14 and FIG. 16, as shown in FIG. 16, after four sub-first electrode connection structures 31 are respectively connected to signal lines, the signal lines connected to the four sub-first electrode connection structures 31 are electrically connected to the drive chip 51 through a general signal line. The transmissions of electrical signals to the four sub-first electrode connection structures 31 can be realized by driving the general signal line on the chip 51. Referring to the embodiment shown in FIG. 14, based on the first electrode signal lines 50 shown in FIG. 16, a plurality of sub-first electrode signal lines 501 (not shown) extending along the first direction XX and/or along the second direction YY are further arranged, to electrically connect the first plurality of electrode signal lines 50 (including the sub-first electrode signal lines 501) in parallel, and indirectly connect the four sub-first electrode connection structures 31 in parallel.

The sub-first electrode signal lines 501 shown by the thin line in FIG. 14 may belong to the first electrode signal lines 50, or may be additional auxiliary signal lines, which are not specifically limited herein. Users may arrange the sub-first electrode signal line 501 according to actual needs. Furthermore, the first electrode signal lines 50 extending along the first direction XX and the first electrode signal lines 50 extending along the second direction YY can be arranged on a same layer. Alternatively, the first electrode signal lines 50 extending along the first direction XX and the first electrode signal lines 50 extending along the second direction YY may be arranged on different layers. The first electrode signal lines 50 arranged on different layers can be connected to each other in parallel through punching. Drawing thick lines and thin lines of the first electrode signal lines in FIG. 14 is only used to illustrate how to connect the plurality of sub-first electrode connection structures 31 in parallel, but not used to limit thicknesses of the first electrode signal lines in an actual design of the display panel. Users can arrange physical properties of the first electrode signal lines in the display panel according to actual needs.

Figure 17:
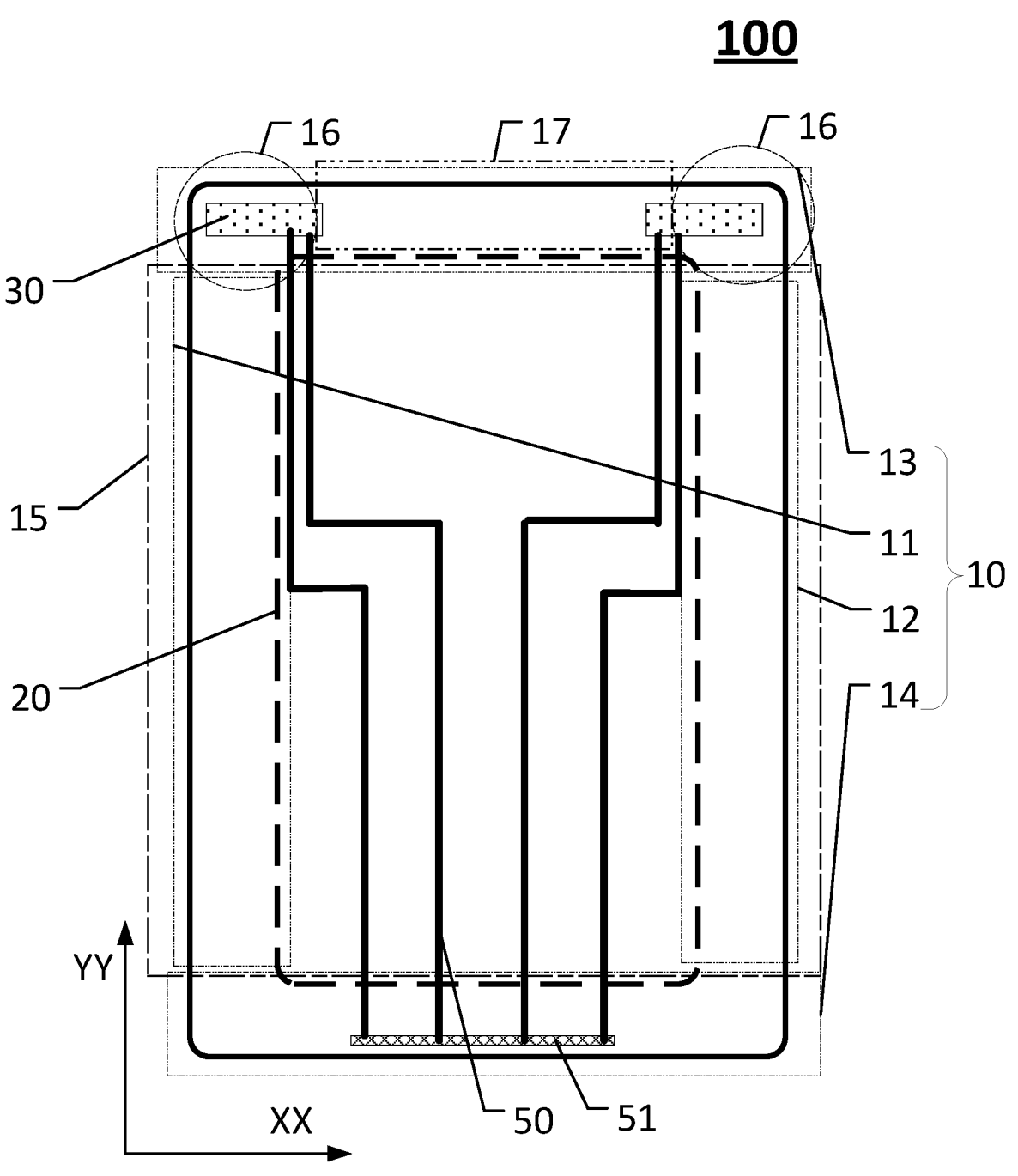
FIG. 17 illustrates another top view of a display panel consistent with various embodiments of the present disclosure.

FIG. 17 illustrates another top view of a display panel consistent with various embodiments of the present disclosure. Referring to FIG. 15 and FIG. 17, optionally, at least two first electrode signal lines 50 are electrically connected to the first electrode connection structure 30.

In one optional embodiment, the display panel 100 includes at least two first electrode signal lines 50. For example, When the first electrode connection structure 30 is respectively arranged in the corner areas 16 on both sides of a second area 17 along the first direction XX, as shown in FIG. 15, two corner areas 16 can be arranged to be electrically connected to different first electrode signal lines 50 respectively to realize transmissions of electrical signals from each first electrode signal line 50 to the first electrode connection structure 30 arranged in the corner areas 16 and realize a separate control of each first electrode connection structure 30 and a diversified driving need of the display panel 100 when required by a design.

In addition, as shown in FIG. 17, one first electrode connection structure 30 can also be arranged to be electrically connected to at least two first electrode signal lines 50 at a same time. On the one hand, even if a certain first electrode signal line 50 electrically connected to the first electrode connection structure 30 is disconnected, other first electrode signal lines 50 can still transmit related electrical signals to the first electrode connection structure 30 to avoid a problem that some electrical signals cannot be transmitted in the display panel 100, and improve a use yield of the related display panel 100. On the other hand, arranging a same first electrode connection structure 30 to be electrically connected to the plurality of first electrode signal lines 50 increases number of first electrode signal lines 50 in the display panel 100, which is also conductive to reducing an overall impedance of the first electrode connection structure 30, thereby reducing a load of the first electrode connection structure 30, which is conductive to improving a transmission effect of electrical signals related to the first electrode connection structure 30 and improving a display effect of the display panel 100.

Figure 18:
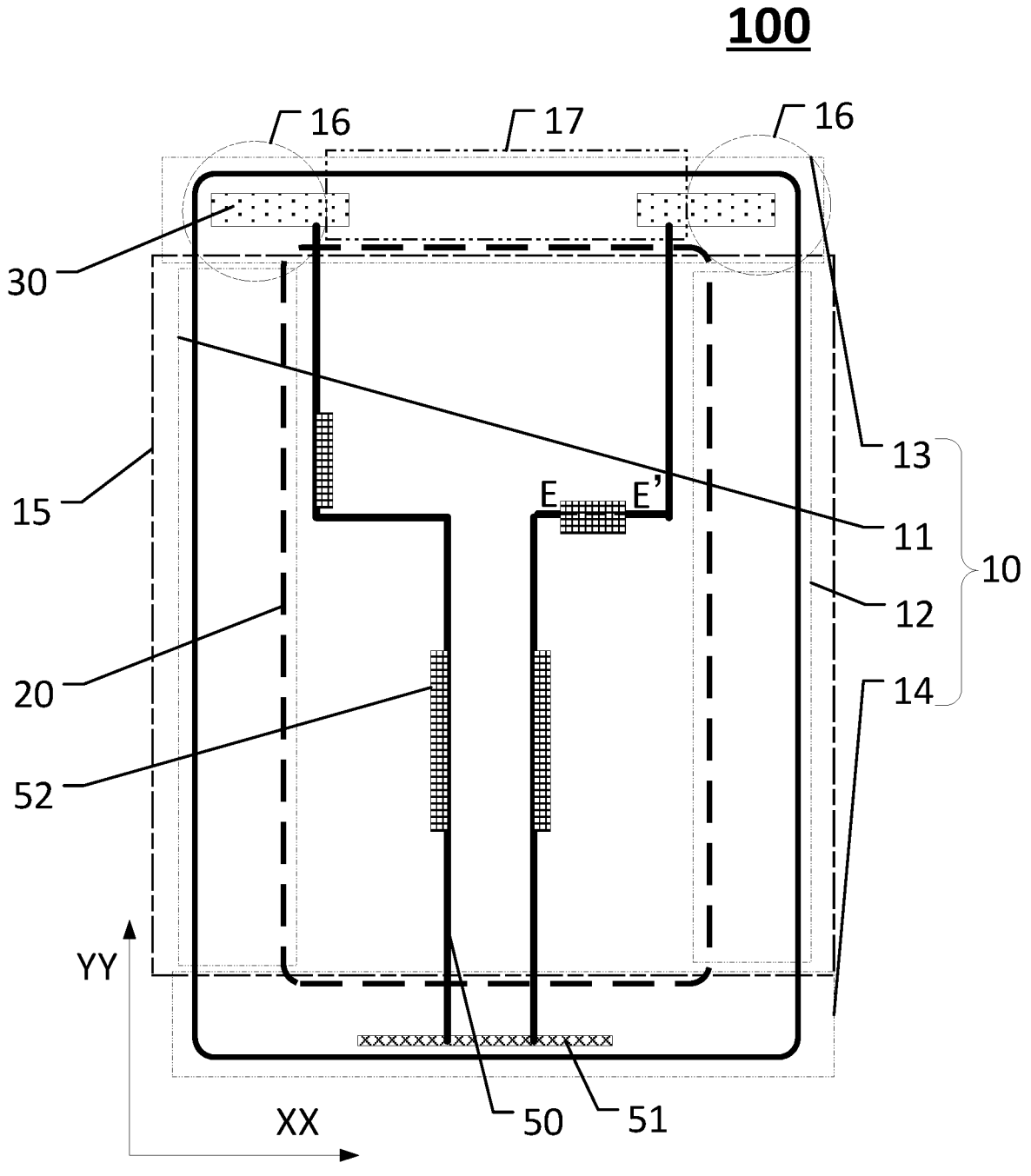
FIG. 18 illustrates another top view of a display panel consistent with various embodiments of the present disclosure.
Figure 19:
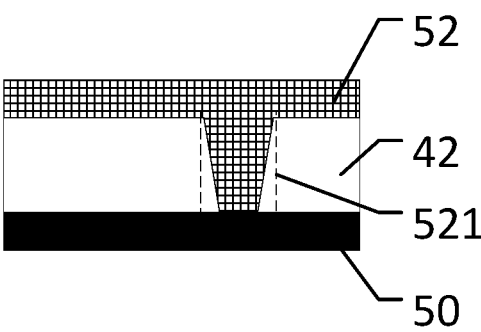
FIG. 19 illustrates a cross-sectional view of EE' in FIG. 18 consistent with various embodiments of the present disclosure.

FIG. 18 illustrates another top view of a display panel consistent with various embodiments of the present disclosure. FIG. 19 illustrates a cross-sectional view of EE' in FIG. 18 consistent with various embodiments of the present disclosure. Referring to FIG. 18 and FIG. 19, the display panel further includes metal components 52. Along the direction perpendicular to the plane where the display panel 100 is located, the metal components 52 and the first electrode signal lines 50 are arranged on different layers, and the metal components 52 are connected in parallel to at least part of the first electrode signal lines 50.

In one optional embodiment, the display panel 100 further includes the metal components 52. Along the direction perpendicular to the plane where the display panel 100 is located, the metal components 52 and the first electrode signal lines 50 can be arranged on different layers. The metal components 52 and at least part of the first electrode signal lines 50 are connected in parallel, which is equivalent to connecting the metal components 52 in parallel to the first electrode signal lines 50, so that an overall impedance of the first electrode signal lines 50 can be reduced and loads of the first electrode signal lines 50 are reduced, which is conducive to improving an effect of the first electrode signal lines 50 on transmitting electrical signals, and further improving a display effect of the display panel 100.

In one embodiment, as shown in FIG. 18 and FIG. 19, corresponding metal components 52 can be arranged on different layers at positions of at least part of the first electrode signal lines 50. For example, the metal components 52 can be arranged on a film layer of the first electrode signal lines 50 facing a light-emitting surface of the display panel 100. A metal component 52 can be further electrically connected to a corresponding first electrode signal line 50 through a connection via hole 521 to realize parallel connections between part of the first electrode signal lines 50 an the metal components 52, which is equivalent to connecting conductive structural components in parallel to at least part of the first electrode signal lines 50 in the display panel 100, so that an impedance of the corresponding first electrode signal lines 50 is reduced, which is conducive to reducing voltage drops on the first electrode signal lines 50 in the display panel 100, improving a display brightness uniformity of the display panel 100, and improving an effect of a user's visual experience.

In addition, a metal component 52 can also be arranged on a film layer of a layer structure where a first electrode signal line 50 is located away from a light-emitting surface of the display panel 100. The metal component 52 is further electrically connected to a corresponding first electrode signal line 50 through a connection via hole, which can also realize a structural arrangement of connecting part of the first electrode signal lines 50 to the metal components 52 in parallel to improve an effect of a user's visual experience.

The present disclosure does not limit thickness, width, and length of a metal component 52. Users can select the physical conditions such as thickness, width, and length of the metal component 52 connected in parallel to a first electrode signal line 50 according to a wiring space in the display panel 100 and a requirement for impedance reduction to achieve a best effect of reducing a voltage drop of the display panel 100.

It should be noted that connecting the metal components 52 to the first electrode signal lines 50 in parallel is only one mode to reduce a load of the first electrode signal line 50 provided by the present disclosure. In addition, loads of the first electrode signal lines 50 can also be reduced by increasing widths of at least part of the first electrode signal lines 50 along the second direction YY and/or along the first direction XX, or by increasing thicknesses of at least part of the first electrode signal lines 50 along the direction perpendicular to the plane where the display panel 100 is located, or by using low-impedance materials to form the first electrode signal lines 50.

It should be noted that, increasing number of the first electrode signal lines 50, connecting the metal components 52 in parallel to the first electrode signal lines 50, increasing widths of the first electrode signal lines 50, increasing thickness of the first electrode signal lines 50, or using low impedance materials to form the first electrode signal lines 50 can all reduce loads of the first electrode signal lines 50. Users can apply any of the above five methods according to design needs. Users can apply any 2, 3, or 4 of the above five methods according to needs to reduce loads of the first electrode signal lines 50. In addition, when conditions permit, the user can also apply above five methods at a same time to reduce loads of the first electrode signal lines 50 to reduce an impact of the first electrode signal lines on electrical signals transmitted by the first electrode connection structure 30 and ensure a good display effect of the display panel 100.

Figure 20:
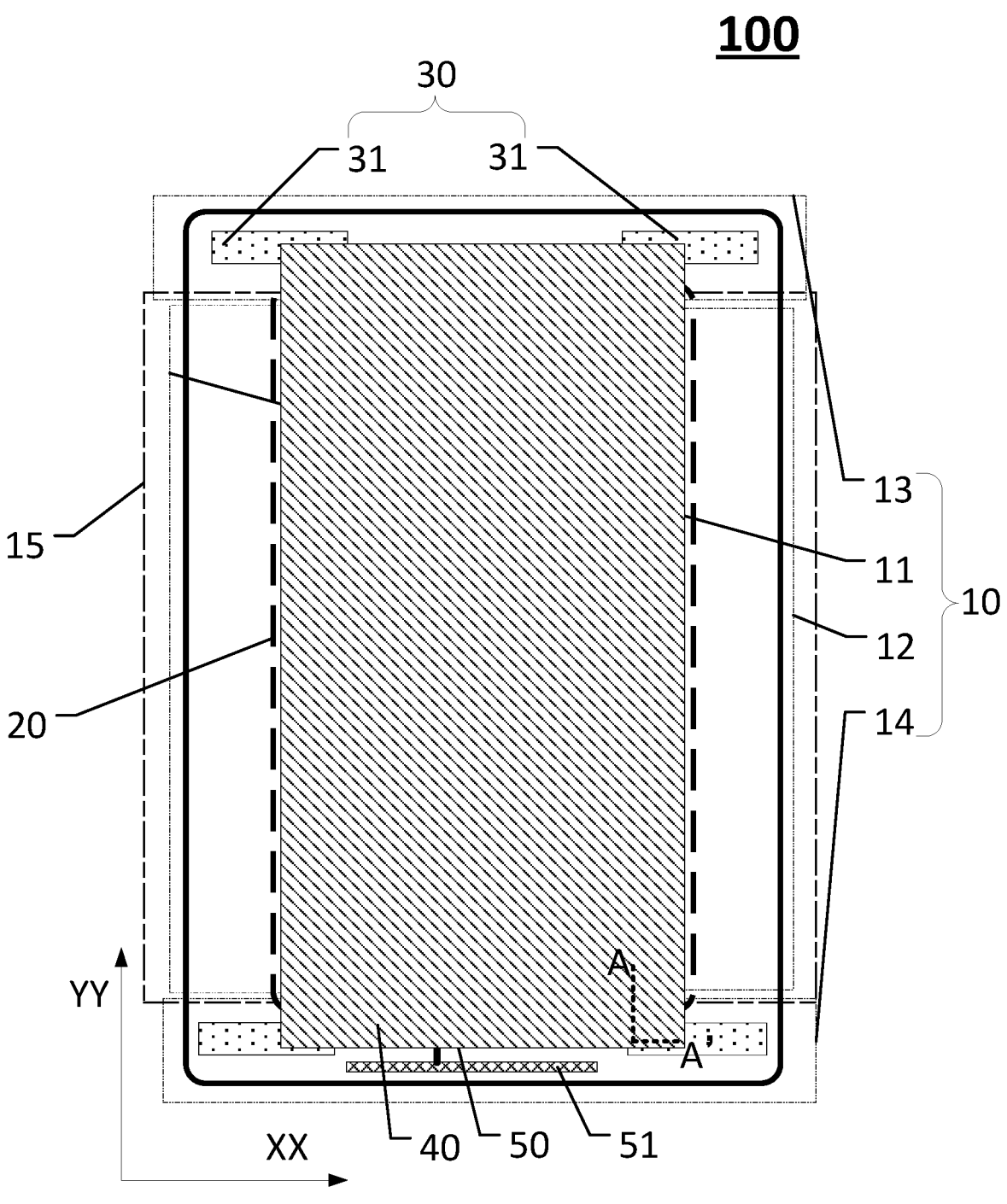
FIG. 20 illustrates another top view of a display panel consistent with various embodiments of the present disclosure.
Figure 21:
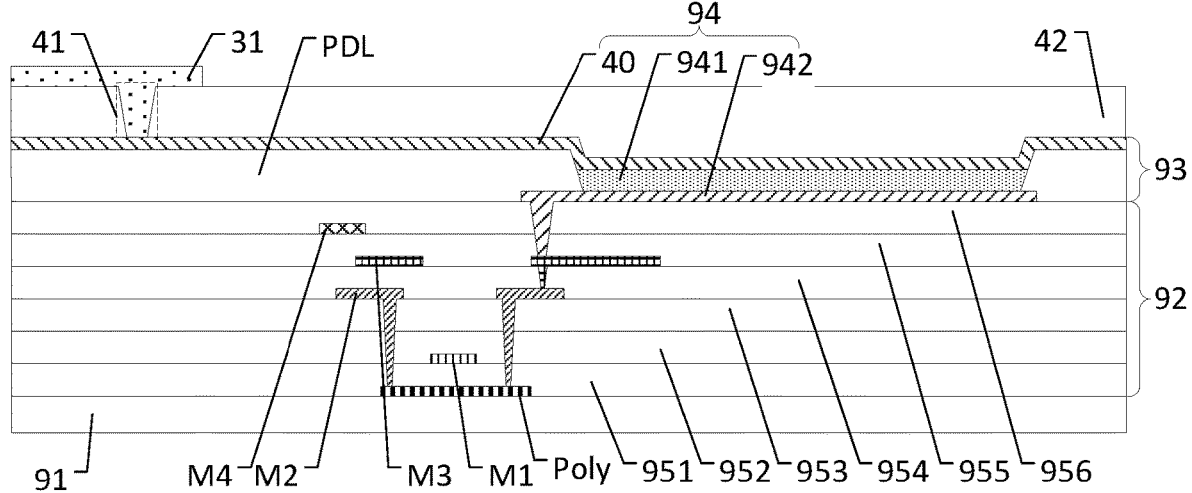
FIG. 21 illustrates a cross-sectional view of AA' in FIG. 20 consistent with various embodiments of the present disclosure.

FIG. 20 illustrates another top view of a display panel consistent with various embodiments of the present disclosure. FIG. 21 illustrates a cross-sectional view of AA' in FIG. 20 consistent with various embodiments of the present disclosure. Referring to FIG. 20 and FIG. 21, the display panel further includes a display area 20 and a first electrode 40 in the display area 20 and at least part of the non-display area 10. The first electrode 40 and the first electrode connection structure 30 are arranged on different layers. The first electrode connection structure 30 includes a plurality of sub-first electrode connection structures 31. Along the direction perpendicular to the plane where the display panel 100 is located, the first electrode 40 and the sub-first electrode connection structure 31 are electrically connected through a first via hole 41.

In one optional embodiment, the display panel 100 also includes the display area 20. For example, the non-display area 10 can be arranged to surround the display area 20. The display panel 100 can also include the first electrode 40. The first electrode 40 can be arranged in the display area 20 and at least partially extends to the non-display area 10.

The display panel 100 is arranged with the first electrode connection structure 30 at a same time. The first electrode connection structure 30 may be arranged to be composed of two or more sub-first electrode connection structures 31. The sub-first electrode connection structures 31 are all arranged on a same layer. The first electrode 40 and the first electrode connection structure 30 can be arranged on different layers. At a same time, along the direction perpendicular to a light-emitting surface of the display panel 100, part of the sub-first electrode connection structures 31 overlap a corresponding first electrode 40. Further, through the first via hole 41 arranged along the direction perpendicular to the light-emitting surface of the display panel 100, the electrical connection between the first electrode 40 and the sub-first electrode connection structures 31 which have an overlapping area with the first electrode 40 can be realized. An insulating layer 42 may be filled between the first electrode 40 and the sub-first electrode connection structures 31 to avoid crosstalk between electrical signals.

In the present disclosure, taking the display panel 100 being an OLED display panel as an example, the non-display area of the OLED display panel is arranged with a PVEE lap structure, and a cathode which are electrically connected to the PVEE signal lines. The PVEE lap structure needs to be arranged in the OLED display panel to lap the cathode, so that power supply voltage signals transmitted by the PVEE signal lines are transmitted to the cathode through the PVEE lap structure. As shown in FIG. 21, the OLED display panel includes a plurality of light-emitting elements 94. Along the direction perpendicular to the plane where the display panel 100 is located, a light-emitting element 94 may include an anode 942, a light-emitting layer 941, and a cathode (40). The first electrode 40 can be electrically connected to the cathode (40) corresponding to the light emitting element 94 of the OLED display panel on a same layer. Specifically, the cathode (40) of the light emitting element 94 extends to the non-display area 10 to arrange the first electrode 40. Therefore, as shown in FIG. 21, in the present disclosure, by arranging an electrical connection between the first electrode 40 and the first electrode connection structure 30 (sub-first electrode connection structure 31) through the first via hole 41, an electrical signal transmitted by the first electrode signal line 50 to the first electrode 40 (cathode of the light emitting element 94) through the first electrode connection structure 30 electrically connected thereto can be realized, so that the electrical signal is used to control whether the light-emitting element 94 is in a light-emitting state.

In the present disclosure, the electrical connection between the first electrode 40 and the first electrode connection structure 30 in the non-display area 10 is realized by arranging the first electrode 40 to be connected to part of the first electrode connection structures 31 through the first via hole 41, so that an electrical signal is transmitted to the first electrode 40 through the first electrode connection structure 30. Compared with a display panel used in the art, the first electrode connection structure 30 for transmitting electrical signals to the first electrode 40 is arranged in the third non-display area 13 and/or the fourth non-display area 14. As shown in FIG. 20, most of the first electrode connection structure 30 can be arranged in the corner areas 16 corresponding to the third non-display area 13 and/or the fourth non-display area 14, which is conductive to reducing an area occupation of the non-display area 10 by the electrical connection setting between the first electrode connection structure 30 and the first electrode 40 in the display panel 100. That is, by using part of the third non-display area 13 and/or the fourth non-display area 14 with redundant spaces to arrange a connection between the first electrode connection structure 30 and the first electrode 40, an occupation of the area (power signal wiring area 04) where the first electrode connection structure and the first electrode connection structure are originally arranged in the display panel in the art is avoided, thereby reducing required spaces of the first non-display area 11 and the second non-display area 12 in the corresponding display panel 100 and realizing a narrow frame design of the display panel 100.

FIG. 21 illustrates a schematic diagram of the film layer structure of the display panel 100. The display panel 100 may include a substrate 91, an array layer 92, and a light output layer 93. In addition, the display panel may also include an encapsulation layer (not shown) on a side of the light output layer 93 away from the substrate 91. The light-emitting element 94 may include the anode 942, the light-emitting layer 941, and the cathode (40) stacked in sequence. The light-emitting layer 941 and the cathode (40) may be sequentially arranged on a side of the anode 942 away from the substrate 91. When a power supplies an appropriate voltage, cavities of the anode 942 and electrons of the cathode (40) may combine in the light-emitting layer 941 to generate bright light. In addition, a side of the substrate 91 facing the light-exiting layer 93 may further include a poly (an active layer), a first metal layer M1, a second metal layer M2, a third metal layer M3, a fourth metal layer M4, and a pixel definition layer PDL. A first insulating film 951 may be arranged between the poly (active layer) and the first metal layer M1, a second insulating film 952 and a third insulating film 953 may be arranged between the first metal layer M1 and the second metal layer M2, a fourth insulating film 954 may be arranged between the second metal layer M2 and the third metal layer M3, a fifth insulating film 955 may be arranged between the third metal layer M3 and the fourth metal layer M4, and a sixth insulating film 956 may be arranged between the fourth metal layer M4 and the anode 942. An arrangement of the insulating films can avoid a crosstalk problem between the electrical signals transmitted by adjacent film layers and can also make surfaces of the insulating films on the side away from the substrate 91 have flat surfaces, which is more suitable for an arrangement of other film layers on the side of the insulation films away from the substrate 91.

It should be noted that, FIG. 21 is only an example of a cross-sectional view of an OLED display panel, which is used to illustrate the embodiment in which the cathode (40) of the light-emitting element 94 extends to the non-display area to form the first electrode 40. Users can also adjust specific film structures of the display panel according to needs. In addition, FIG. 21 only takes the first electrode connection structure 30 arranged on the side away from the substrate 91 of the cathode (40) as an example, which is not limited herein. Users can also arrange the first electrode connection structure 30 in a film layer structure on the side of the cathode (40) facing the substrate 91 as required, as long as electrical signals received by the first electrode connection structure 30 can be transmitted to the cathode (40)

Figure 22:
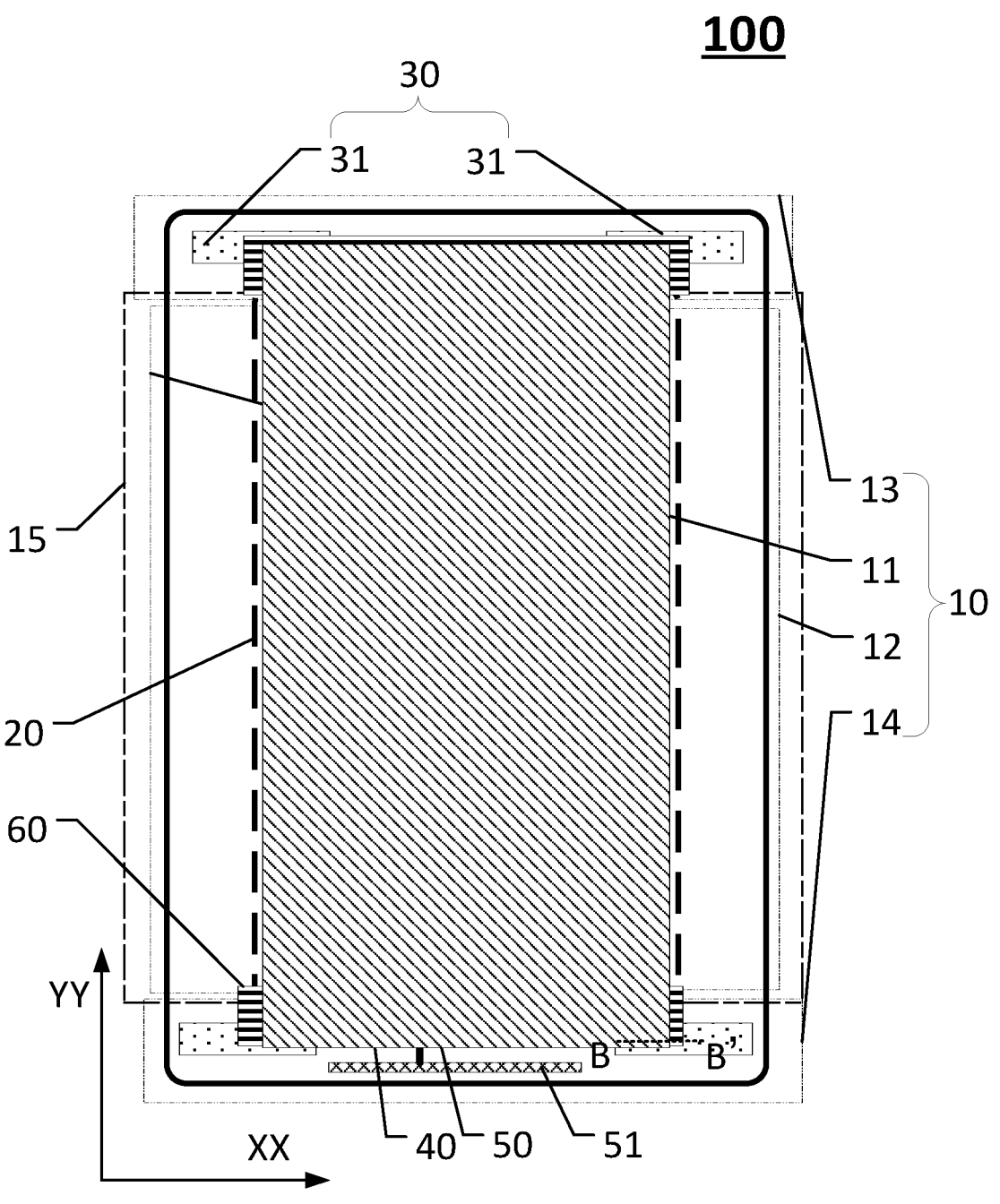
FIG. 22 illustrates another top view of a display panel consistent with various embodiments of the present disclosure.
Figure 23:
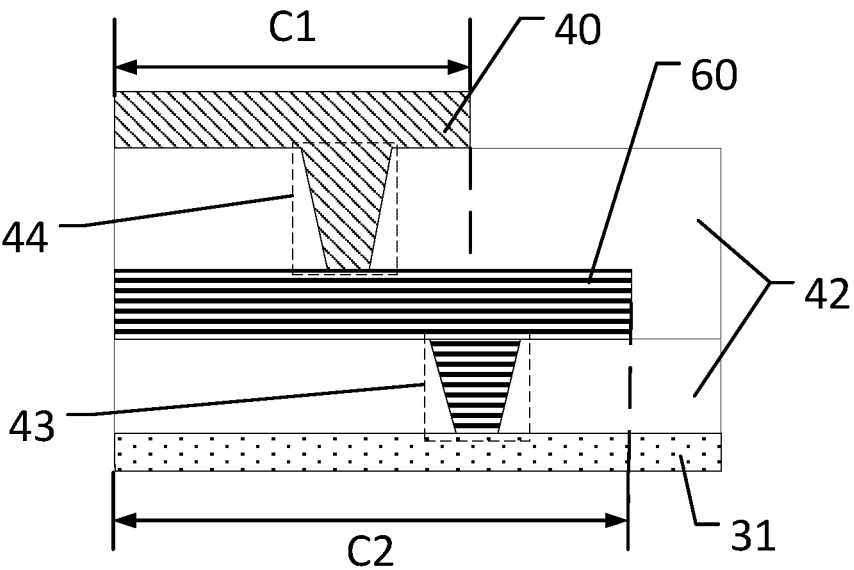
FIG. 23 illustrates a cross-sectional view of BB' in FIG. 22 consistent with various embodiments of the present disclosure.

FIG. 22 illustrates another top view of a display panel consistent with various embodiments of the present disclosure. FIG. 23 illustrates a cross-sectional view of BB' in FIG. 22 consistent with various embodiments of the present disclosure. Referring to FIG. 22 and FIG. 23 in conjunction with FIG. 20, optionally, the display panel can further include the display area 20 and the first electrode 40 in the display area 20 and at least part of the non-display area 10; and a first medium 60 at least partially in the non-display area 10. The first electrode 40, the first electrode connection structure 30 and the first medium 60 are all arranged on different layers.

The first electrode connection structure 30 includes a plurality of sub-first electrode connection structures 31. Along the direction perpendicular to the plane where the display panel 100 is located, the first medium 60 and the first electrode 40 include a first overlapping area C1. The first medium 60 and at least one sub-first electrode connection structure 31 include a second overlapping area C2. The first electrode 40 and the first medium 60 are electrically connected through the second via hole 44 in the first overlapping area C1. Moreover, the sub-first electrode connection structure 31 and the first medium 60 are electrically connected through a third via hole 43 in the second overlapping area C2.

In one optional embodiment, the display panel 100 also includes a display area 20. For example, the non-display area 10 can be arranged surround the display area 20. The display panel 100 can also include the first electrode 40. For example, the first electrode 40 can be arranged in the display area 20 and at least partially extend to the non-display area 10.

In the present disclosure, taking the display panel 100 being an OLED display panel as an example, the non-display area of the OLED display panel is arranged with a PVEE lap structure and a cathode which are electrically connected to the PVEE signal lines. In the OLED display panel, The PVEE lap structure needs to be arranged to lap the cathode, so that power supply voltage signals transmitted by the PVEE signal lines are transmitted to the Cathode of the OLED display panel through the PVEE lap structure. Referring to FIG. 21, the OLED display panel includes a plurality of light-emitting elements 94. Along the direction perpendicular to the plane where the display panel 100 is located, a light-emitting element 94 may include the anode 942, the light-emitting layer 941, and the cathode (40) stacked in sequence. The first electrode 40 can be arranged on a same layer as the cathode (40) corresponding to the light-emitting element 94 of the OLED display panel. Specifically, the cathode (40) of the light-emitting element 94 can be extended to the non-display area 10 to arrange the first electrode 40. Therefore, in the present disclosure, by arranging the electrical connection between the first electrode 40 and the first electrode connection structure 30, an electrical signal transmitted by the first electrode signal lines 50 can be transmitted to the first electrode 40 (cathode of the light emitting element 94) through the first electrode connection structure 30 which is electrically connected to the first electrode 40, so that the electrical signal is used to control whether the light emitting element 94 is in a light emitting state. Since a film thickness of the cathode is generally arranged relatively thin, an electrical signal transmission medium such as the first medium 60 can be further added. The first medium 60 is used as a transfer station for electrical signals to be transmitted between the cathode and the PVEE lap structure, to avoid a poor stability of a lap between the cathode and the PVEE lap structure that may exist when the thickness of the cathode film is very thin. An addition of the first medium 60 is used to improve a lap stability of the cathode and the PVEE lap structure, to ensure a transmission effect of electrical signals between the cathode and the PVEE lap structure.

That is, in the present disclosure, the first electrode connection structure 30 can be electrically connected to one end of a first electrode signal line 50, the other end of the first electrode signal line 50 is electrically connected to the drive chip 51. The first electrode connection structure 30 laps the first medium 60, and the first medium 60 laps the first electrode 40, to realize transmissions of electrical signals transmitted by the drive chip 51 received by the first electrode signal line 50 to the first electrode 40 through the first electrode connection structure 30 and the first medium 60, e.g., transmissions of the PVEE signals to the cathodes of the light-emitting elements in the display panel for realizing an adjustment of whether the light-emitting elements are in a display state.

Specifically, as shown in FIG. 22 and FIG. 23, in one optional embodiment, the display panel 100 is arranged with the first electrode connection structure 30. The first electrode connection structure 30 may be arranged to be composed of two or more sub-first electrode connection structures 31. The first sub-electrode connection structures 31 can be arranged on a same layer. At a same time, the display panel 100 can be arranged with a first medium 60 at least partially in the non-display area 10. The first electrode 40, the first electrode connection structure 30 and the first medium 60 are all arranged on different layers. Further, along the direction perpendicular to the plane where the display panel 100 is located, the first medium 60 and the first electrode 40 can be arranged to include a first overlapping area C1. An electrical connection between the first medium 60 and the first electrode 40 can be realized in the first overlapping area C1 through the second via hole 44 arranged along the direction perpendicular to the light-emitting surface of the display panel 100. Along the direction perpendicular to the plane where the display panel 100 is located, the first medium 60 and at least one sub-first electrode connection structure 31 can be arranged to include the second overlapping area C2. An electrical connection between the first medium 60 and the first electrode connection structure 30 can be realized in the second overlapping area C2 through the third via hole 43 arranged along the direction perpendicular to the light-emitting surface of the display panel 100. Specifically, along the direction perpendicular to the plane where the display panel 100 is located, the first medium 60 can be arranged between the first electrode connection structure 30 and the first electrode 40. An electrical connection between the first electrode 40 and the first medium 60 is realized through the second via hole 44, and an electrical connection between the first medium 60 and the first electrode connection structure 30 is realized through the third via hole 43, that is, the electrical connection between the first electrode 40 and the first electrode connection structure 30 is realized through the first medium 60 as an intermediate transition. The insulating layer 42 may be filled between the first electrode 40 and the first medium 60 and between the first sub-electrode connection structure 31 and the first medium 60 to avoid crosstalk between electrical signals. By arranging the first medium 60 as a bridge structure between the first electrode 40 and the first electrode connection structure 31, a degree of freedom in designing the electrical connection between the first electrode 40 and the first electrode connection structure 30 is improved.

In the embodiment, by arranging the first medium 60 as a transition structure for the electrical connection between the first electrode 40 and part of the sub-first electrode connection structures 31, and combining the second via hole 44 and the third via hole 43 to realize the electrical connection between the first electrode 40 and the first electrode connection structure 30 in the non-display area 10, transmissions of electrical signals to the first electrode 40 through the first electrode connection structure 30 are realized. The first electrode connection structure 30 for transmitting electrical signals to the first electrode 40 is arranged in the third non-display area 13 and/or the fourth non-display area 14, which is conducive to reducing an area occupation of the non-display area 10 by the electrical connection arrangement between the first electrode connection structure 30 and the first electrode 40 in the display panel 100. That is, by using part of the third non-display area 13 and/or the fourth non-display area 14 with redundant spaces to arrange a connection between the first electrode connection structure 30 and the first electrode 40, an occupation of a connection area between the first electrode connection structure 30 and the first electrode 40 originally provided in the display panel 100 in the art can be avoided, thereby reducing required spaces of the first non-display area 11 and the second non-display area 12 in the corresponding display panel 100.

In addition, it should be noted that, along the direction perpendicular to the plane where the display panel 100 is located, the light-emitting element 94 included in the display panel 100 may include the anode 942, the light-emitting layer 941, and the cathode (40) stacked in sequence. The first medium 60 in the non-display area 10 can be formed by extending a film layer of the anode 942 in the non-display area 10. However, the first medium 60 and the anode 942 are arranged to be insulated, that is, the first medium 60 and the anode 942 can be made of a same material on a same layer. The first electrode 40 in the non-display area 10 can be formed by extending the cathode to the non-display area 10, that is, the first electrode 40 and the cathode can be made of a same material on a same layer. The above arrangement can simplify a forming process of the display panel 100, reduce a forming cost of the display panel 100, and improve a forming efficiency of the display panel 100. The embodiment is only one optional embodiment of the first medium 60 and the first electrode 40, and users can also adjust a film position and a forming process of the first medium 60 and the first electrode 40 in the display panel 100 according to actual needs.

Figure 24:
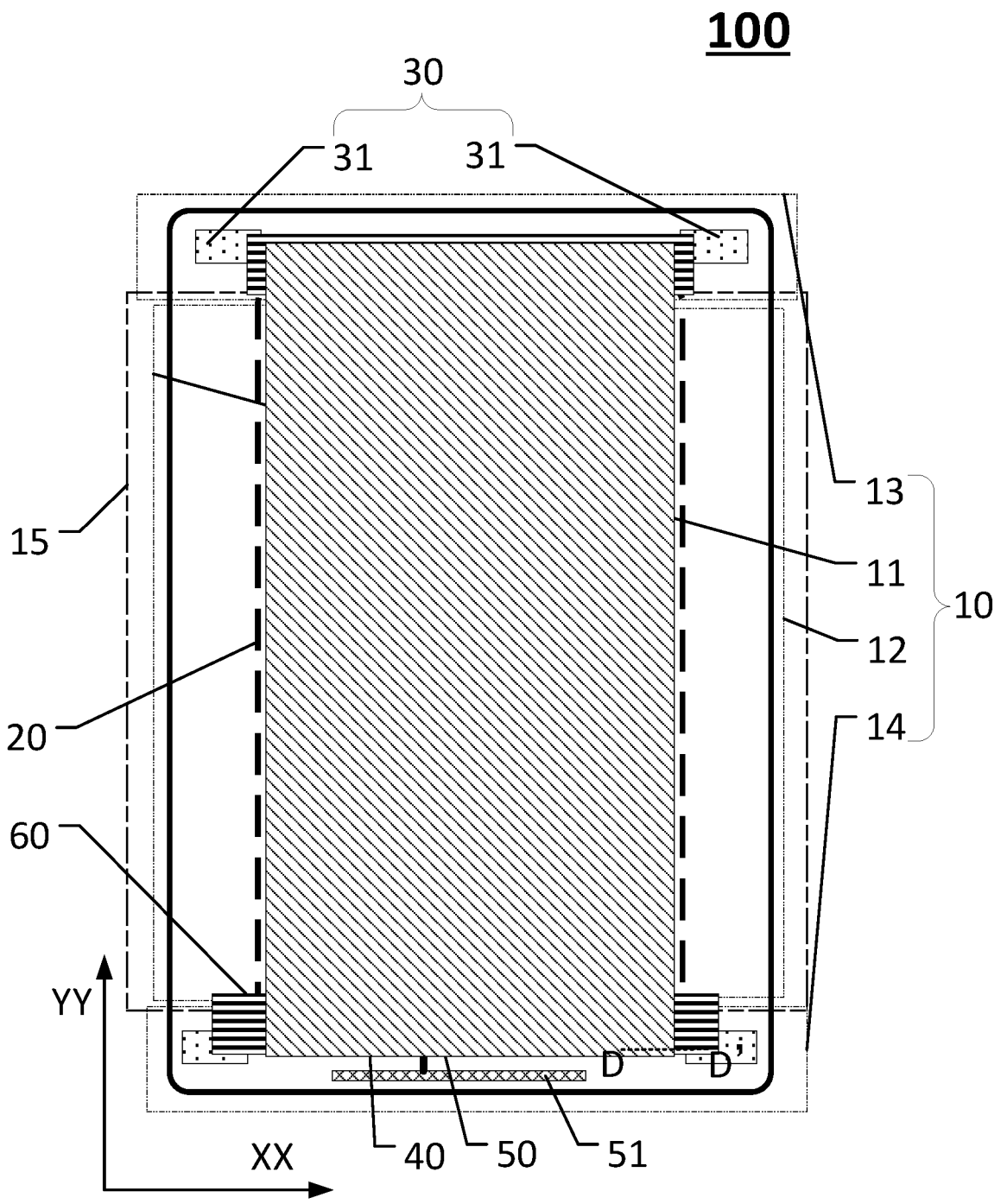
FIG. 24 illustrates another top view of a display panel consistent with various embodiments of the present disclosure.
Figure 25:
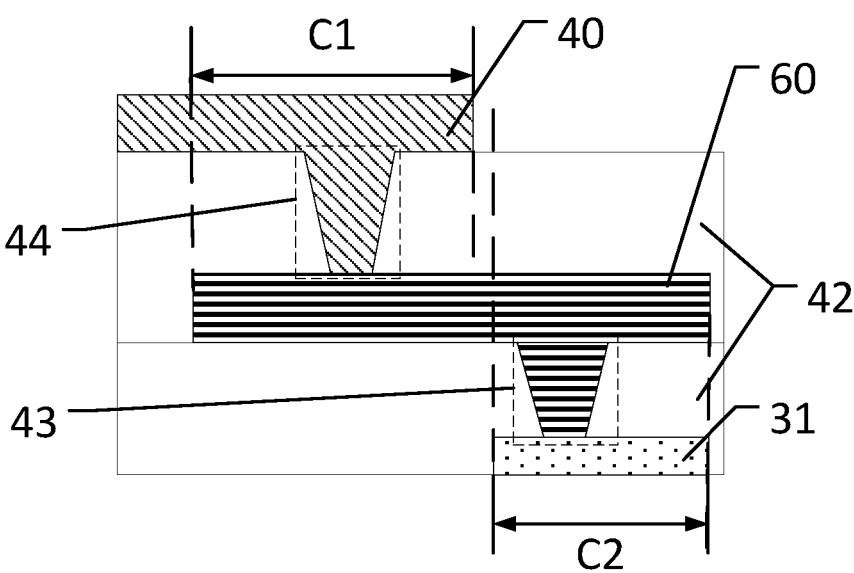
FIG. 25 illustrates a cross-sectional view of DD' in FIG. 24 consistent with various embodiments of the present disclosure.

FIG. 24 illustrates another top view of a display panel consistent with various embodiments of the present disclosure. FIG. 25 illustrates a cross-sectional view of DD' in FIG. 24 consistent with various embodiments of the present disclosure. Referring to FIG. 24 and FIG. 25 in conjunction with FIG. 20, optionally, along the direction perpendicular to the plane where the display panel 100 is located, the first overlapping area C1 does not overlap the second overlapping area C2.

In one optional embodiment, when the display panel 100 is arranged with the first electrode 40, the first medium 60, and the first electrode connection structure 30 on different layers as described above, along the direction perpendicular to the plane where the display panel 100 is located, the first overlapping area C1 is between the first medium 60 and the first electrode 40, and the second overlapping area C2 is between the first medium 60 and the first electrode connection structure 30. Along the direction perpendicular to the plane where the display panel 100 is located, the first overlapping area C1 can be arranged not to overlap the second overlapping area C2, which improves a degree of freedom in designing the electrical connection between the first electrode 40 and the first electrode connection structure 30, ensures a normal operation of the display panel 100 and reduces the overall area of the non-display area 10 of the display panel 100.

Referring to FIG. 22 and FIG. 23 in conjunction with FIG. 20, optionally, along the direction perpendicular to the plane where the display panel 100 is located, the first overlapping area C1 and the second overlapping area C2 include at least a partial overlapping area.

In one optional embodiment, when the display panel 100 is provided with the first electrode 40, the first medium 60, and the first electrode connection structure 30 arranged on different layers as described above, along the direction perpendicular to the plane where the display panel 100 is located, the first overlapping area C1 is between the first dielectric 60 and the first electrode 40, and the second overlapping area C2 is between the first dielectric 60 and the first electrode connection structure 30. Along the direction perpendicular to the plane where the display panel 100 is located, arranging the first overlapping area C1 and the second overlapping area C2 to have an overlapping area can further reduce occupied spaces of the first overlapping area C1 and the second overlapping area C2 in the non-display area 10, thereby avoiding an excessive area occupation in the non-display area 10 by the first electrode 40, the first medium 60, the first electrode connection structure 30 and electrical connections therebetween, which is conductive to further narrowing the area of the remaining non-display area 10 on the basis of reducing the area required for the first non-display area 11 and the second non-display area 12 in the display panel 100, guaranteeing a good transmission effect of electrical signals in the display panel 100, and ensuring a display effect of the corresponding display device.

It should be noted that, The first overlapping area C1 and second overlapping area C2 described above are arranged in the third non-display area 13 and/or the fourth non-display area 14 and can be arranged in the corner areas 16 corresponding to the third non-display area 13 and/or the fourth non-display area 14. In the plane perpendicular to the plane where the display panel 100 is located, arranging the first overlapping area C1 and the second overlapping area C2 to have an overlapping area is conductive to reducing an area occupation in the non-display area 10 by an electrical connection arrangement between the first electrode connection structure 30, the first medium 60 and the first electrode 40 in the display panel 100. That is, by utilizing part of the third non-display area 13 and/or the fourth non-display area 14 with redundant space to arrange connections between the first electrode connection structure 30, the first medium 60 and the first electrode 40, an occupation of relevant connection areas where the first electrode connection structure 30, the first medium 60 and the first electrode 40 are originally arranged in the display panel in the art is avoided, thereby reducing the required areas for the left and right frames of the display panel.

Figure 26:
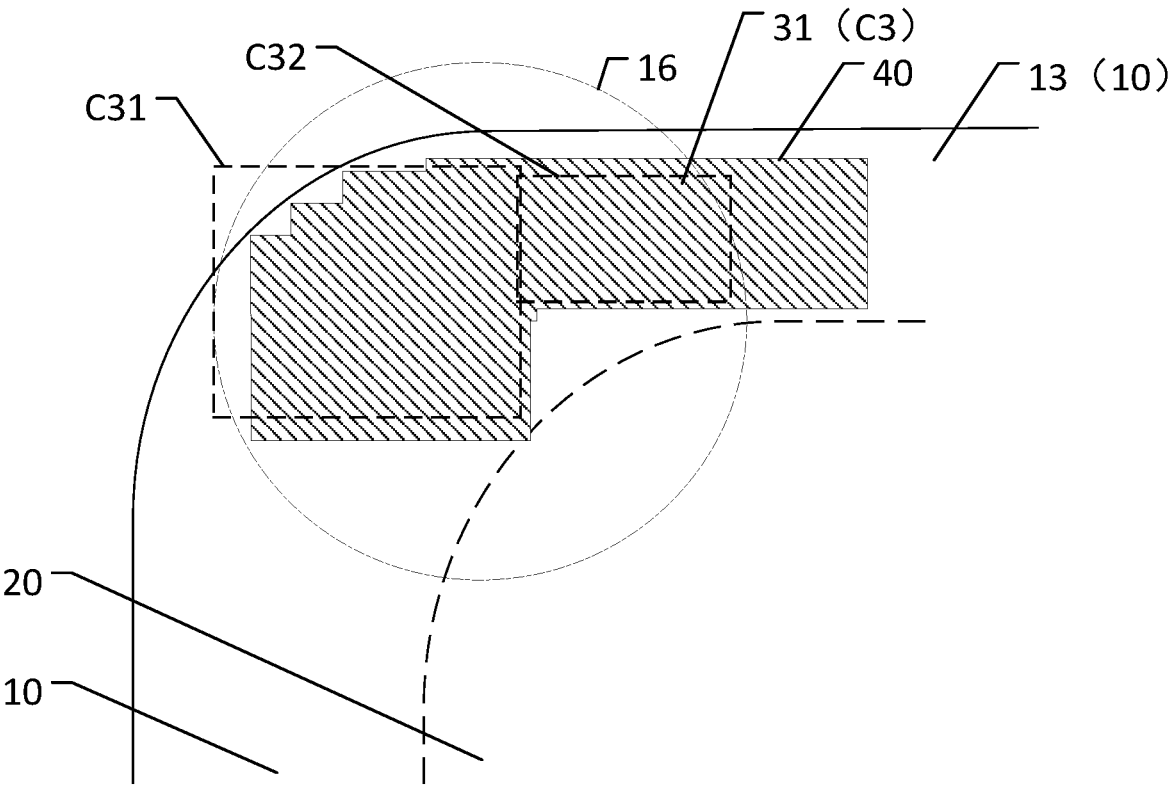
FIG. 26 illustrates an enlarged view of a corner area consistent with various embodiments of the present disclosure.

FIG. 26 illustrates an enlarged view of a corner area consistent with various embodiments of the present disclosure. Referring to FIG. 6 and FIG. 26, optionally, along the direction perpendicular to the plane where the display panel 100 is located, the first electrode 40 and at least one sub-first electrode connection structure 31 include a third overlapping area C3. Along an extension direction of the third overlapping area C3, the third overlapping area C3 includes at least a first sub-area C31, a second sub-area C32. Along an extension direction perpendicular to the third overlapping area C3, a width of the first sub-area C31 is different from a width of the second sub-area C32.

In one optional embodiment, when the display panel 100 includes the first electrode 40 and the first electrode connection structure 30 arranged on different layers, the first electrode connection structure 30 may be composed of a plurality of sub-first electrode connection structures 31, at least one sub-first electrode connection structure 31 is electrically connected to the first electrode 40 to realize an electrical connection between the first electrode connection structure 30 and the first electrode 40. Along the direction perpendicular to the plane where the display panel 100 is located, the third overlapping area C3 can be arranged between the sub-first electrode connection structure 31 and the first electrode 40. Therefore, in one optional embodiment, along a direction surrounding the display area 20, the third overlapping area C3 can be divided into at least a first sub-area C31 and a second sub-area C32. Along the direction perpendicular to the direction surrounding display area 20, a width of the first sub-area C31 may be different from a width of the second sub-area C32.

Taking the third overlapping area C3 being a corner area 16 as an example, the third overlapping area C3 may include a first sub-area C31 and a second sub-area C3. The first sub-area C31 is in a central area of the corner area 16, and the second sub-area C32 is on a side of the corner area 16 facing the third non-display area 13. In the art, structural components can be arranged in redundant spaces in the corner area, the redundant spaces in the central area of the corner area are most sufficient. Therefore, an electrical connection position of the first electrode 40 and the first electrode connection structure 30 can be arranged according to sizes of the redundant spaces in the non-display area 10, so that the electrical connection between the first electrode 40 and the first electrode connection structure 30 can fully and accurately utilize the redundant spaces in the non-display area in the art, which can reduce an occupation of the connection area between the first electrode connection structure 30 and the first electrode 40 originally arranged in the display panel in the art, thereby not only reducing spaces required for the non-display area 10 in the display panel 100, but also realizing the electrical connection between the structural components in the display panel 100, and ensuring a good operation of the display panel 100.

Figure 27:
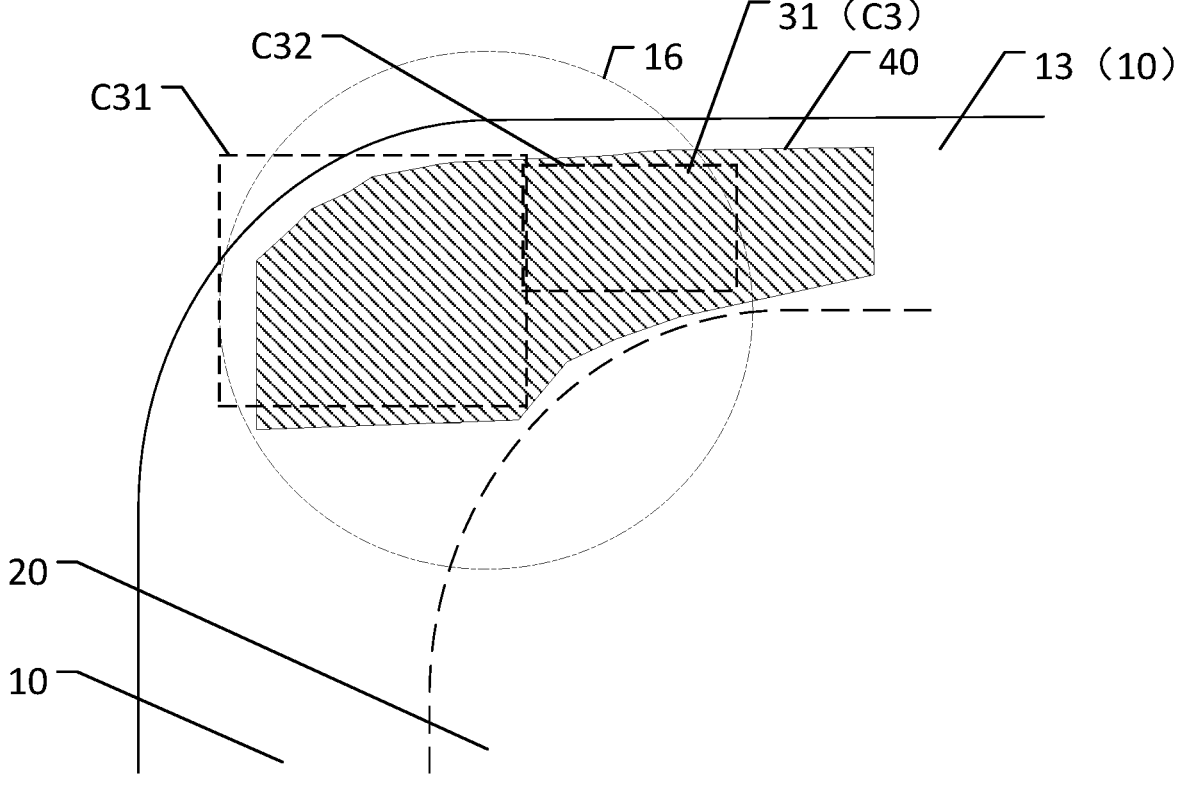
FIG. 27 illustrates another enlarged view of a corner area consistent with various embodiments of the present disclosure.

FIG. 27 illustrates another enlarged view of a corner area consistent with various embodiments of the present disclosure. Referring to FIG. 6 and FIG. 27, optionally, along a direction perpendicular to the plane where the display panel 100 is located, the first electrode 40 and at least one sub-first electrode connection structure 31 include the third overlapping area C3. Along an extending direction of the third overlapping area C3, at least a width of part of the third overlapping area C3 along the extending direction perpendicular to the extending direction of the third overlapping area C3 gradually increases.

In one optional embodiment, when the display panel 100 includes the first electrode 40 and the first electrode connection structure 30 arranged on different layers, the first electrode connection structure 30 may be composed of a plurality of sub-first electrode connection structures 31. At least one sub-first electrode connection structure 31 is electrically connected to the first electrode 40 to realize the electrical connection between the first electrode connection structure 30 and the first electrode 40. Along the direction perpendicular to the plane where the display panel 100 is located, the sub-first electrode connection structure 31 and the first electrode 40 can be arranged to have the third overlapping area C3 therebetween. Therefore, in one optional embodiment, along the direction surrounding the display area 20, a width of the third overlapping area C3 can be arranged to gradually increase.

Taking the third overlapping area C3 being a corner area 16 as an example, the third overlapping area C3 may include the first sub-area C31 and the second sub-area C32. The first sub-area C31 is in a central area of the corner area 16, the second sub-area C32 is on a side of the corner area 16 facing the third non-display area 13. In the art, structural components can be arranged in redundant spaces in the corner area, the redundant spaces in the central area of the corner area are most sufficient. Therefore, along the direction from the first sub-area C31 to the second sub-area C32, widths of the redundant spaces in the corner area 16 become larger and larger. Therefore, an electrical connection position of the first electrode 40 and the first electrode connection structure 30 can be arranged according to sizes of the redundant spaces in the non-display area 10, i.e., along the extending direction of the third overlapping region C3, a width of the third overlapping area C3 arranged at least partially along the extending direction perpendicular to the third overlapping area C3 gradually increases, so that the electrical connection between the first electrode 40 and the first electrode connection structure 30 can fully and accurately utilize the redundant spaces in the non-display area in the art, which can reduce an occupation of the connection area between the first electrode connection structure 30 and the first electrode 40 originally arranged in the display panel in the art, thereby not only reducing spaces required for the non-display area 10 in the display panel 100, but also realizing the electrical connection between the structural components in the display panel 100, and ensuring a good operation of the display panel 100.

Figure 28:
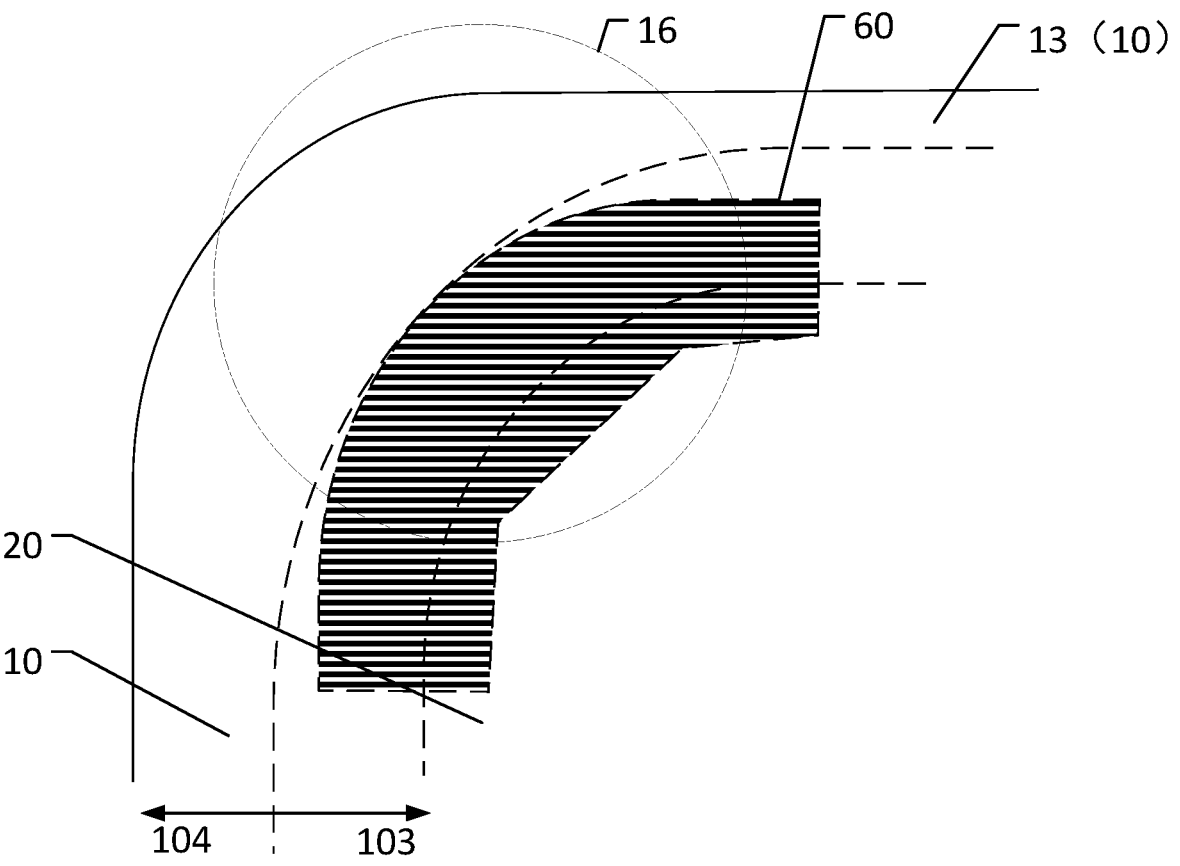
FIG. 28 illustrates another enlarged view of a corner area consistent with various embodiments of the present disclosure.
Figure 29:
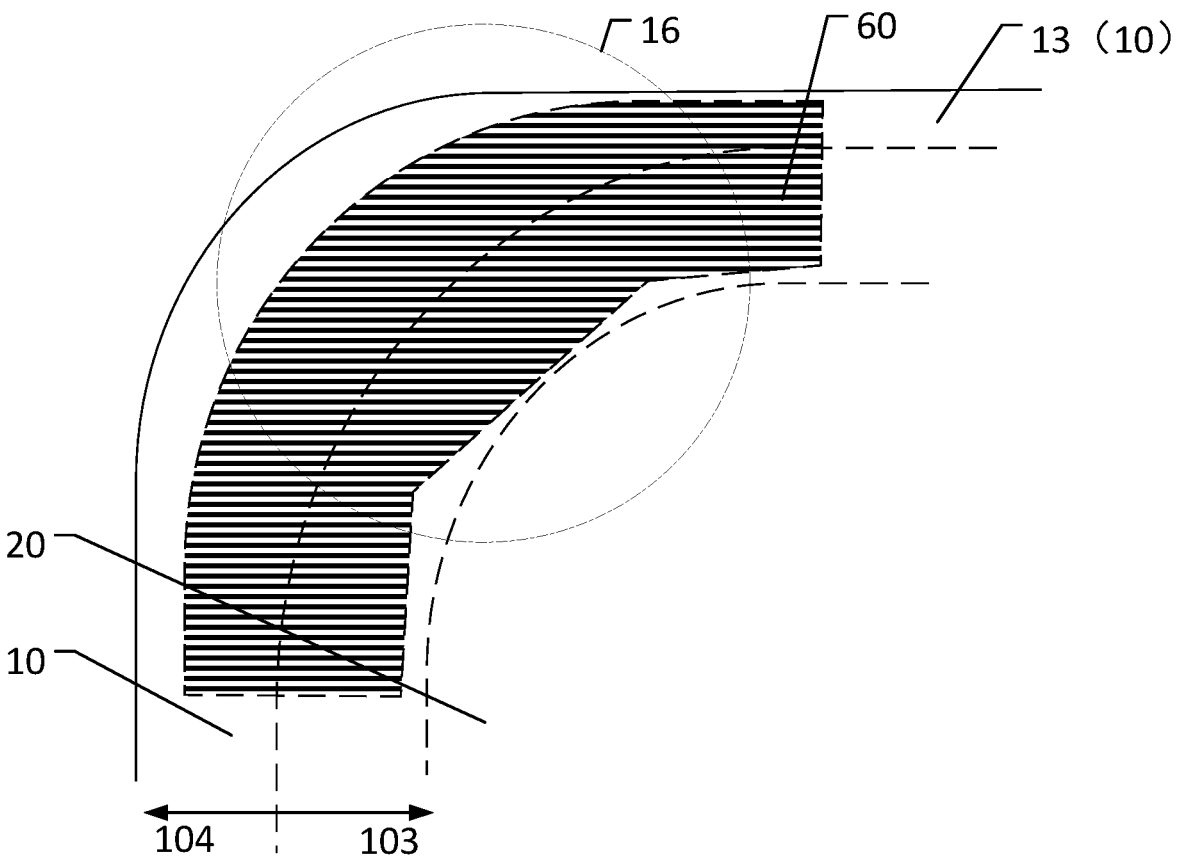
FIG. 29 illustrates another enlarged view of a corner area consistent with various embodiments of the present disclosure.

FIG. 28 illustrates another enlarged view of a corner area consistent with various embodiments of the present disclosure. FIG. 29 illustrates another enlarged view of a corner area consistent with various embodiments of the present disclosure. Referring to FIG. 22 and FIG. 28 and FIG. 29, optionally, the display panel includes a display area 20. Along a direction of the display area 20 pointing to the non-display area 10, the non-display area 10 includes at least a third sub-area 103 and a fourth sub-area 104. The third sub-area 103 is on a side of the fourth sub-area 104 facing the display area 20. The first dielectric layer 60 is at least in the third sub-area 103 or at least in the third sub-area 103 and the fourth sub-area 104.

In one optional embodiment, when the display panel 100 includes the first electrode 40, the first medium 60 and the first electrode connection structure 30 arranged on different layers, the electrical connection between the first electrode 40 and the first medium 60 can be arranged in the non-display area 10, and the electrical connection between the first medium 60 and the first electrode connection structure 30 can be arranged in the non-display area 10. Along the direction of the display area 20 pointing to the non-display area 10, the non-display area 10 can be arranged to include a third sub-area 103 and a fourth sub-area 104. The third sub-area 103 is on the side of the fourth sub-area 104 facing the display area 20. According to needs, the first medium 60 can be arranged only in the third sub-area 103, or in the third sub-area 103 and at least part of the display area 20. Alternatively, according to needs, the first medium 60 can be arranged only in the third sub-area 103 and the fourth sub-area 104, or in the third sub-area 103, the fourth sub-area 104 and at least part of the display area 20.

Since the entire first electrode 40 can be arranged on the display area 20 and extend at least partly to the non-display area 10, when the electrical connection between the first electrode 40 and the first medium 60 is realized in the non-display area 10, only the third sub-area 103 can be occupied for the electrical connection between the first electrode 40 and the first medium 60. Areas of the first electrode 40 and the first medium 60 that need to be arranged in the non-display area 10 in the display panel 100 are relatively small, which can save materials required for forming the first electrode 40 and the first medium 60 in the display panel 100 and reduce a forming cost of the display panel 10. In a case where the area of the non-display area 10 allows, the first electrode 40 and the first medium 60 can also be arranged to occupy more space in the non-display area 10 to realize the electrical connection between the first electrode 40 and the first medium 60. For example, both the first dielectric 60 and the first electrode 40 can be arranged at least in the third sub-area 103 and the fourth sub-area 104, thereby increasing an overlapping area between the first medium 60 and the first electrode 40, so that the electrical connection between the first medium 60 and the first electrode 40 can be realized more easily, which improves a stability of the electrical connection between the first medium 60 and the first electrode 40, and is conductive to reducing an implementation difficulty of the electrical connection between the first medium 60 and the first electrode 40.

In addition, when the first medium 60 is in the third sub-area 103 and the fourth sub-area 104 in the non-display area 10, the electrical connection between the first medium 60 and the first electrode connection structure 30 can also be arranged in the fourth sub-area 104, and the electrical connection between the first dielectric 60 and the first electrode 40 is arranged in the third sub-area 103, thereby improving a degree of freedom in designing the electrical connection between the first electrode 40 and the first electrode connection structure 30, ensuring a normal operation of the display panel 100, and reducing an overall area of the non-display area 10 in the display panel 100.

It should also be noted that, when the first medium 60 is arranged at least in the third sub-area 103 and the fourth sub-area 104, even if the first medium 60 is burned in a forming process of the display panel 100, the burn may not completely carbonize the first medium 60, thereby not affecting material properties of the first medium 60 and not affecting an effect of the first medium 60 as a transition structure on transmissions of electrical signals between the first electrode 40 and the first electrode connection structure 30. Further, a width of the first medium 60 can also be arranged to not exceed an outer boundary of a packaging area of the display panel 100. At a same time, the first medium 60 can be arranged to be wrapped by an organic film on an upper layer in a subsequent forming process, which can avoid a burning problem of the first medium 60 in a subsequent cutting process of the display panel, ensure an integrity of the first medium 60, avoid affecting the electrical connection between the first medium 60 and the first electrode connection structure 30, and/or avoid affecting the electrical connection between the first medium 60 and the first electrode 40, thereby ensuring a stability of electric signal transmissions between the first electrode 40 and the first electrode connection structure 30.

In addition, low-impedance materials can also be selected to forming the first medium 60, which reduce a load of the first medium 60, reduce an impact on electrical signals transmitted between the first electrode 40 and the first electrode connection structure 30 and ensure a good display effect of the display panel 100.

In addition, it should be noted that, referring to FIG. 21, the light-emitting element 94 included in the display panel 100 may include an anode 942, a light-emitting layer 941, and a cathode (40) stacked in sequence along the direction perpendicular to the plane where the display panel 100 is located. The first medium 60 in the non-display area 10 can be formed by extending the anode 942 to the non-display area 10, that is, the first medium 60 and the anode 942 can be made of a same material on a same layer, the first electrode 40 in the non-display area 10 can be formed by extending the cathode to the non-display area 10, that is, the first electrode 40 and the cathode can be made of a same material on a same layer, thereby simplifying a forming process of the display panel 100, reducing a time required for forming the display panel 100 and improve a forming efficiency of the display panel 100. The above embodiment is only one optional embodiment of the first medium 60 and the first electrode 40 provided in the present disclosure. Users can also adjust a film layer position and a forming process of the first medium 60 and the first electrode 40 in the display panel 100 according to actual needs.

Figure 30:
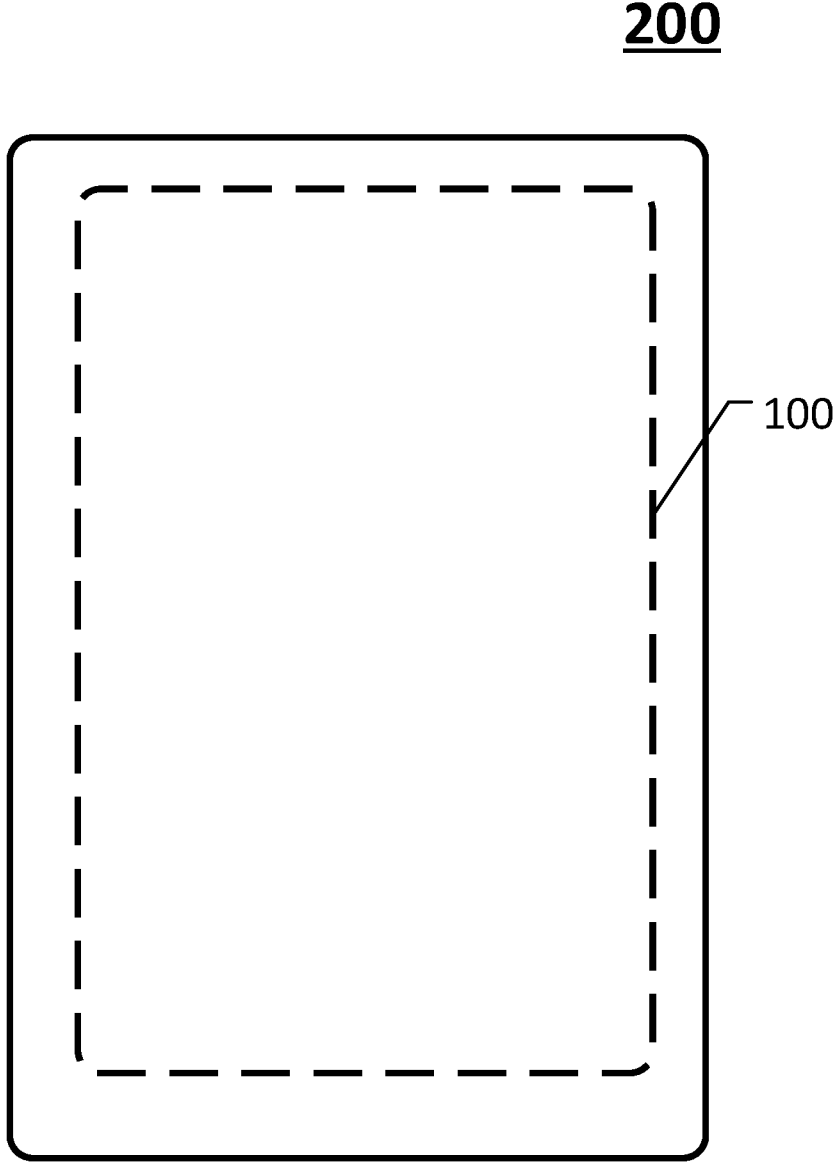
FIG. 30 illustrates a schematic diagram of a display device consistent with various embodiments of the present disclosure.

FIG. 30 illustrates a schematic diagram of a display device consistent with various embodiments of the present disclosure. Referring to FIG. 30 in conjunction with FIGS. 2-29, based on a same inventive concept, the present disclosure also provides a display device 200 including any display panel 100 provided in the present disclosure.

It should be noted that, for the embodiment of the display device 200 provided in the embodiment of the present application, reference may be made to the above embodiments of the display panel 100, which is not repeated herein. The display device 200 may be any product and component with a display function such as a mobile phone, a tablet computer, a television, a monitor, a notebook computer, a navigator, or the like.

In summary, the display panel, and the display device provided by the present disclosure at least achieve the following beneficial effects.

The present specification provides a display panel and a display device. Since the third non-display area and the fourth non-display area of the display panel still have some areas that can be adjusted to add structural components. In the present specification, the first electrode connection structure in the display panel is arranged in the third non-display area and/or the fourth non-display area oppositely arranged along the second direction. The first electrode connection structure is arranged outside the first area running through the display panel along the first direction, so that the first electrode connection structure can be arranged away from the first non-display area and the second non-display area in the display panel, and available spaces in the third non-display area and/or the fourth non-display area can be utilized, thereby saving spaces required for arranging structural components in the first non-display area and the second non-display area, which is conducive to further reducing spaces required by the first non-display area and the second non-display area in the display panel, and further realizing a design scheme of narrower frames of display products.

Although some specific embodiments of the present invention have been described in detail through examples, a person skilled in the art should understand that the above examples are for illustration only and not intended to limit the scope of the present disclosure. A person skilled in the art should understand that modifications can be made to the above embodiments without departing from the scope and spirit of the present disclosure. The scope of the present disclosure is defined by the appended claims.

What is claimed is:

1. A display panel, comprising:
a non-display area including a first non-display area and a second non-display area oppositely arranged along a first direction, and a third non-display area and a fourth non-display area oppositely arranged along a second direction, the first direction intersecting the second direction;
a first electrode connection structure at least in the third non-display area and/or the fourth non-display area;
a first area running through the display panel along the first direction, and the first electrode connection structure being outside the first area; and
a display area, and a first electrode in the display area and at least part of the non-display area, wherein the first electrode connection structure includes a plurality of sub-first electrode connection structures, and the first electrode connection structure is configured to transmit electrical signals to the first electrode.

2. The display panel according to claim 1, wherein the non-display area includes corner areas, and the first electrode connection structure is at least partially in the corner areas.

3. The display panel according to claim 1, wherein the non-display area includes corner areas and a second area connecting two corner areas, and the first electrode connection structure runs through the second area.

4. The display panel according to claim 1, wherein:
the display area includes first electrode signal lines electrically connected to the first electrode connection structure.

5. The display panel according to claim 4, wherein at least two first electrode signal lines are electrically connected to the first electrode connection structure.

6. A display panel, comprising:
a non-display area including a first non-display area and a second non-display area oppositely arranged along a first direction, and a third non-display area and a fourth non-display area oppositely arranged along a second direction, the first direction intersecting the second direction;
a first electrode connection structure at least in the third non-display area and/or the fourth non-display area;
a first area running through the display panel along the first direction, and the first electrode connection structure being outside the first area; and
a display area including first electrode signal lines electrically connected to the first electrode connection structure,
wherein the first electrode connection structure includes a plurality of sub-first electrode connection structures, and at least two sub-first electrode connection structures are connected in parallel.

7. A display panel, comprising:
a non-display area including a first non-display area and a second non-display area oppositely arranged along a first direction, and a third non-display area and a fourth non-display area oppositely arranged along a second direction, the first direction intersecting the second direction;

a first electrode connection structure at least in the third non-display area and/or the fourth non-display area;
a first area running through the display panel along the first direction, and the first electrode connection structure being outside the first area;
a display area including first electrode signal lines electrically connected to the first electrode connection structure; and
at least one metal component, along a direction perpendicular to a plane where the display panel is located, the metal components being arranged on a different layer from the first electrode signal lines and connected in parallel with at least part of the first electrode signal lines.

8. A display panel, comprising:
a non-display area including a first non-display area and a second non-display area oppositely arranged along a first direction, and a third non-display area and a fourth non-display area oppositely arranged along a second direction, the first direction intersecting the second direction;
a first electrode connection structure at least in the third non-display area and/or the fourth non-display area;
a first area running through the display panel along the first direction, and the first electrode connection structure being outside the first area;
a display area and a first electrode in the display area and at least part of the non-display area;
the first electrode and the first electrode connection structure being arranged on different layers; and
the first electrode connection structure including a plurality of sub-first electrode connection structures, and along a direction perpendicular to a plane where the display panel is located, the first electrode and the sub-first electrode connection structure being electrically connected through a first via hole.

9. The display panel according to claim 8, wherein:
along the direction perpendicular to the plane where the display panel is located, the first electrode and at least one sub-first electrode connection structure includes a third overlapping area;
along an extending direction of the third overlapping area, the third overlapping area includes at least a first sub-area and a second sub-area; and
along an extension direction perpendicular to the third overlapping area, a width of the first sub-area is different from a width of the second sub-area.

10. The display panel according to claim 8, wherein:
along the direction perpendicular to the plane where the display panel is located, the first electrode and at least one sub-first electrode connection structure include a third overlapping area; and
along an extending direction of the third overlapping area, a width of at least part of the third overlapping area gradually increases along an extending direction perpendicular to the extending direction of the third overlapping area.

11. A display panel, comprising:
a non-display area including a first non-display area and a second non-display area oppositely arranged along a first direction, and a third non-display area and a fourth non-display area oppositely arranged along a second direction, the first direction intersecting the second direction;
a first electrode connection structure at least in the third non-display area and/or the fourth non-display area;

a first area running through the display panel along the first direction, and the first electrode connection structure being outside the first area;

a display area and a first electrode in the display area and at least part of the non-display area;

a first medium at least partially in the non-display area;

the first electrode, the first electrode connection structure and the first medium all being arranged on different layers;

the first electrode connection structure including a plurality of sub-first electrode connection structures, along a direction perpendicular to a plane where the display panel is located, the first medium and the first electrode including a first overlapping area, and the first medium and at least one sub-first electrode connection structure including a second overlapping area; and the first electrode and the first medium being electrically connected through a second via hole in the first overlapping area, and the sub-first electrode connection structure and the first medium being electrically connected through a third via hole in the second overlapping area.

12. The display panel according to claim 11, wherein: along the direction perpendicular to the plane where the display panel is located, the first overlapping area does not overlap the second overlapping area.

13. The display panel according to claim 11, wherein: along the direction perpendicular to the plane where the display panel is located, the first overlapping area and the second overlapping area include at least a partial overlapping area.

14. The display panel according to claim 11, wherein: along a direction of the display area pointing to the non-display area, the non-display area includes at least a third sub-area and a fourth sub-area, and the third sub-area is on a side of the fourth sub-area facing the display area; and the first medium is at least in the third sub-area; or the first medium is at least in the third sub-area and the fourth sub-area.

15. A display device comprising a display panel comprising:

a non-display area including a first non-display area and a second non-display area oppositely arranged along a first direction, and a third non-display area and a fourth non-display area oppositely arranged along a second direction, the first direction intersecting the second direction;

a first electrode connection structure at least in the third non-display area and/or the fourth non-display area;

a first area running through the display panel along the first direction, and the first electrode connection structure being outside the first area; and a display area, and a first electrode in the display area and at least part of the non-display area, wherein the first electrode connection structure includes a plurality of sub-first electrode connection structures, and the first electrode connection structure is configured to transmit electrical signals to the first electrode.

16. The display device according to claim 15, wherein the non-display area of the display panel includes corner areas, and the first electrode connection structure is at least partially in the corner areas.

17. The display device according to claim 15, wherein the non-display area of the display panel includes corner areas and a second area connecting two corner areas, and the first electrode connection structure runs through the second area.

18. The display device according to claim 15, wherein:

the display area includes first electrode signal lines electrically connected to the first electrode connection structure.

19. A display device comprising a display panel comprising:

a non-display area including a first non-display area and a second non-display area oppositely arranged along a first direction, and a third non-display area and a fourth non-display area oppositely arranged along a second direction, the first direction intersecting the second direction;

a first electrode connection structure at least in the third non-display area and/or the fourth non-display area;

a first area running through the display panel along the first direction, and the first electrode connection structure being outside the first area;

a display area and a first electrode in the display area and at least part of the non-display area;

the first electrode and the first electrode connection structure being arranged on different layers; and the first electrode connection structure including a plurality of sub-first electrode connection structures, and along a direction perpendicular to a plane where the display panel is located, the first electrode and the sub-first electrode connection structure being electrically connected through a first via hole.

20. A display device comprising a display panel comprising:

a non-display area including a first non-display area and a second non-display area oppositely arranged along a first direction, and a third non-display area and a fourth non-display area oppositely arranged along a second direction, the first direction intersecting the second direction;

a first electrode connection structure at least in the third non-display area and/or the fourth non-display area;

a first area running through the display panel along the first direction, and the first electrode connection structure being outside the first area;

a display area and a first electrode in the display area and at least part of the non-display area;

a first medium at least partially in the non-display area;

the first electrode, the first electrode connection structure and the first medium all being arranged on different layers;

the first electrode connection structure including a plurality of sub-first electrode connection structures, along a direction perpendicular to a plane where the display panel is located, the first medium and the first electrode including a first overlapping area, and the first medium and at least one sub-first electrode connection structure including a second overlapping area; and the first electrode and the first medium being electrically connected through a second via hole in the first overlapping area, and the sub-first electrode connection structure and the first medium being electrically connected through a third via hole in the second overlapping area.

* * * * *